United States Patent
Xu et al.

(10) Patent No.: US 11,094,244 B2
(45) Date of Patent: Aug. 17, 2021

(54) SCANNING CIRCUIT, DRIVER CIRCUIT, TOUCH DISPLAY PANEL, RECEIVING SWITCHING CIRCUIT AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Shifeng Xu, Beijing (CN); Xiaodong Xie, Beijing (CN); Min He, Beijing (CN); Tengfei Zhong, Beijing (CN); Xinxiu Zhang, Beijing (CN); Bin Pang, Beijing (CN); Yuan Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 2 days.

(21) Appl. No.: 16/638,892

(22) PCT Filed: Nov. 30, 2018

(86) PCT No.: PCT/CN2018/118664
§ 371 (c)(1),
(2) Date: Feb. 13, 2020

(87) PCT Pub. No.: WO2020/107435
PCT Pub. Date: Jun. 4, 2020

(65) Prior Publication Data
US 2021/0065610 A1 Mar. 4, 2021

(51) Int. Cl.
*G06F 3/044* (2006.01)
*G09G 3/20* (2006.01)
(Continued)

(52) U.S. Cl.
CPC ......... *G09G 3/2092* (2013.01); *G06F 3/0412* (2013.01); *G06F 3/0446* (2019.05);
(Continued)

(58) Field of Classification Search
CPC ......... G09G 3/2092; G09G 2310/0267; G09G 2310/0286; G06F 3/044; G06F 3/0446; G06F 3/0412; G06F 3/0416; G06K 9/0002
See application file for complete search history.

(56) References Cited

U.S. PATENT DOCUMENTS

2012/0013574 A1* 1/2012 Murai ................. G02F 1/13338
345/174
2017/0336910 A1* 11/2017 Han ...................... G06F 3/0446

FOREIGN PATENT DOCUMENTS

CN 104021371 A 9/2014
CN 104252277 A 12/2014
(Continued)

*Primary Examiner* — Robert J Michaud
(74) *Attorney, Agent, or Firm* — Banner & Witcoff, Ltd.

(57) ABSTRACT

A scanning circuit, a driver circuit, a touch display panel, a receiving switching circuit and a driving method are disclosed. The scanning circuit includes a function switching circuit and a plurality of shift register units that are cascaded. Each shift register units includes a control terminal and a shift scanning output terminal, and is configured to output a first output signal at the shift scanning output terminal; the function switching circuit includes a mode switching input terminal, a control signal output terminal and a mode scanning output terminal, and the control signal output terminal and the mode scanning output terminal are respectively connected to the control terminals and the shift scanning output terminals of the plurality of shift register units. The function switching circuit is configured to output the control signal to the control terminals or to output a second output signal to the shift scanning output terminals.

20 Claims, 12 Drawing Sheets

(51) Int. Cl.
     *G06F 3/041*       (2006.01)
     *G06K 9/00*        (2006.01)
     *G11C 19/28*       (2006.01)

(52) U.S. Cl.
     CPC ............ *G06K 9/0002* (2013.01); *G11C 19/28* (2013.01); *G09G 2310/0267* (2013.01); *G09G 2310/0286* (2013.01)

(56)            References Cited

FOREIGN PATENT DOCUMENTS

CN          104850292  A     8/2015
CN          205540642  U     8/2016

\* cited by examiner

SCANNING CIRCUIT, DRIVER CIRCUIT, TOUCH DISPLAY PANEL, RECEIVING SWITCHING CIRCUIT AND DRIVING METHOD

The application is a U.S. National Phase Entry of International Application No. PCT/CN2018/118664 filed on Nov. 30, 2018, designating the United States of America. The present application claims priority to and the benefit of the above-identified application and the above-identified application is incorporated by reference herein in its entirety.

TECHNICAL FIELD

Embodiments of the present disclosure relate to a scanning circuit, a driver circuit, a touch display panel, a receiving switching circuit and a driving method.

BACKGROUND

In the field of display technology, a pixel array such as a liquid crystal display panel or an organic light emitting diode (OLED) display panel generally includes a plurality of rows of gate lines and a plurality of columns of data lines which are intersected with the plurality of rows of gate lines. The gate lines can be driven by a bonded integrated driver circuit. In recent years, with the continuous improvement of the preparation technology of amorphous silicon thin film transistors or oxide thin film transistors, the gate line driver circuit can also be directly integrated on the thin film transistor array substrate to form GOA (Gate driver On Array) to drive the gate line. For example, GOA composed of a plurality of shift register units that are cascaded may be used to provide switch state voltage signals (scanning signals) to the plurality of rows of gate lines of the pixel array, so as to control the plurality of rows of gate lines to be sequentially turned on, for example, simultaneously data signals are provided to the pixel units of corresponding rows in the pixel array through data lines to form gray scale voltages required for displaying gray scales of an image at each pixel unit, thereby displaying a frame of image.

Touch screens can be divided into two types according to the difference in structures: out-cell touch screens; and integrated touch screens. Integrated touch screens include on-cell touch screens and in-cell touch screens. In-cell touch screens have been widely used because they can reduce the overall thickness of touch screens and the manufacturing cost of touch screens.

SUMMARY

At least one embodiment of the present disclosure provides a scanning circuit, which comprises a function switching circuit and a plurality of shift register units that are cascaded. Each of the plurality of shift register units that are cascaded comprises a control terminal and a shift scanning output terminal, and is configured to output a first output signal at the shift scanning output terminal in response to a control signal received by the control terminal; the function switching circuit comprises a mode switching input terminal, a control signal output terminal and a mode scanning output terminal, the control signal output terminal is connected to the control terminals of the plurality of shift register units that are cascaded, and the mode scanning output terminal is connected to the shift scanning output terminals of the plurality of shift register units that are cascaded; and the function switching circuit is configured to output the control signal to the control terminals of the plurality of shift register units that are cascaded at the control signal output terminal or to output a second output signal to the shift scanning output terminals of the plurality of shift register units that are cascaded at the mode scanning output terminal, in response to a mode switching input signal received by the mode switching input terminal.

For example, in the scanning circuit provided by an embodiment of the present disclosure, the function switching circuit comprises an phase-inverting circuit and an output control circuit; the phase-inverting circuit is connected to the mode switching input terminal and the control signal output terminal, and is configured to invert a phase of the mode switching input signal received by the mode switching input terminal and to output the phased-inverted mode switching input signal to the control signal output terminal as the control signal; and the output control circuit is connected to the mode switching input terminal and the mode scanning output terminal, and is configured to output the second output signal at the mode scanning output terminal in response to the mode switching input signal received by the mode switching input terminal.

For example, in the scanning circuit provided by an embodiment of the present disclosure, the phase-inverting circuit comprises a first transistor and a second transistor; a gate electrode of the first transistor is connected to the mode switching input terminal so as to receive the mode switching input signal, and a first electrode of the first transistor is connected to the control signal output terminal, and a second electrode of the first transistor is connected to a first voltage terminal so as to receive a first voltage; and a gate electrode and a first electrode of the second transistor are electrically connected to each other and are both connected to a second voltage terminal so as to receive a second voltage, and a second electrode of the second transistor is connected to the control signal output terminal.

For example, in the scanning circuit provided by an embodiment of the present disclosure, the output control circuit comprises a third transistor; and a gate electrode of the third transistor is connected to the mode switching input terminal so as to receive the mode switching input signal, a first electrode of the third transistor is connected to the second voltage terminal so as to receive the second voltage, and a second electrode of the third transistor is connected to the mode scanning output terminal.

For example, in the scanning circuit provided by an embodiment of the present disclosure, each of the plurality of shift register units that are cascaded comprises an input circuit, an output circuit, a first node reset circuit, and an output reset circuit; the input circuit is connected to an input terminal, a first node and the control terminal, and is configured to output an input signal received by the input terminal to the first node in response to the control signal received by the control terminal; the output circuit is connected to the first node and the shift scanning output terminal, and is configured to output the first output signal at the shift scanning output terminal under a control of an electrical level of the first node; the first node reset circuit is connected to a reset terminal and the first node, and is configured to reset the first node in response to a reset signal received by the reset terminal; and the output reset circuit is connected to the reset terminal and the shift scanning output terminal, and is configured to reset the shift scanning output terminal in response to the reset signal received by the reset terminal.

For example, in the scanning circuit provided by an embodiment of the present disclosure, the input circuit comprises a fourth transistor, a gate electrode of the fourth transistor is connected to the control terminal so as to receive the control signal, a first electrode of the fourth transistor is connected to the input terminal so as to receive the input signal, and a second electrode of the fourth transistor is connected to the first node; the output circuit comprises a fifth transistor and a first capacitor, a gate electrode of the fifth transistor is connected to the first node, a first electrode of the fifth transistor is connected to a first clock signal terminal so as to receive a first clock signal as the first output signal, and a second electrode of the fifth transistor is connected to the shift scanning output terminal; a first terminal of the first capacitor is connected to the first node, and a second terminal of the first capacitor is connected to the shift scanning output terminal; the first node reset circuit comprises a sixth transistor, a gate electrode of the sixth transistor is connected to the reset terminal so as to receive the reset signal, a first electrode of the sixth transistor is connected to the first node, and a second electrode of the sixth transistor is connected to a first voltage terminal so as to receive a first voltage; and the output reset circuit comprises a seventh transistor, a gate electrode of the seventh transistor is connected to the reset terminal so as to receive the reset signal, a first electrode of the seventh transistor is connected to the shift scanning output terminal, and a second electrode of the seventh transistor is connected to the first voltage terminal so as to receive the first voltage.

For example, in the scanning circuit provided by an embodiment of the present disclosure, the mode switching input terminal of the function switching circuit receives a first function input signal as the mode switching input signal; in the plurality of shift register units that are cascaded, an input terminal of a shift register unit of a first stage receives a second function input signal as an input signal; an input terminal of a shift register unit of each of other stages except for the first stage is connected to a shift scanning output terminal of a shift register unit of a previous stage of the each of the other stages except for the first stage; and a reset terminal of a shift register unit of each of other stages except for a last stage is connected to a shift scanning output terminal of a shift register unit of a next stage of the each of the other stages except for the last stage.

At least one embodiment of the present disclosure further provides a driver circuit, which comprises M scanning circuits that are cascaded and provided by any embodiment of the present disclosure. M is an integer greater than 1.

For example, in the driver circuit provided by an embodiment of the present disclosure, the driver circuit further comprises M first function input signal lines and M second function input signal lines. An x-th first function input signal line is connected to a mode switching input terminal in a scanning circuit of an x-th stage so as to provide a first function input signal as the mode switching input signal, and an x-th second function input signal line is connected to an input terminal of a shift register unit of a first stage in the scanning circuit of the x-th stage so as to provide a second function input signal; and x is an integer greater than or equal to 1 and less than or equal to M.

For example, in the driver circuit provided by an embodiment of the present disclosure, the M first function input signal lines are in one-to-one correspondence with and further connected to a plurality of output terminals of a first function scanning circuit so as to receive a plurality of output signals shifted and output by the first function scanning circuit as first function input signals.

For example, in the driver circuit provided by an embodiment of the present disclosure, the input terminal of the shift register unit of the first stage in the scanning circuit of the x-th stage is further connected to a shift scanning output terminal of a shift register unit of a last stage in a scanning circuit of an (x−1)-th stage; a reset terminal of a shift register unit of a last stage in the scanning circuit of the x-th stage is connected to a shift scanning output terminal of a shift register unit of a first stage in a scanning circuit of an (x+1)-th stage; and x is an integer greater than or equal to 2 and less than or equal to M.

For example, in the driver circuit provided by an embodiment of the present disclosure, the driver circuit further comprises a reset signal line and a plurality of unidirectional input circuits. The reset signal line is connected to reset terminals of shift register units of the scanning circuits respectively through the plurality of unidirectional input circuits so as to provide an overall reset signal; and input terminals of the plurality of unidirectional input circuits are connected to the reset signal line, and output terminals of the plurality of unidirectional input circuits are in one-to-one correspondence with and connected to reset terminals of a plurality of shift register units that are cascaded.

For example, in the driver circuit provided by an embodiment of the present disclosure, each of the plurality of unidirectional input circuits comprises a diode; and a first electrode of the diode is connected to the reset signal line, and a second electrode of the diode is connected to a reset terminal of a shift register unit.

At least one embodiment of the present disclosure further provides a touch display panel, which comprises a driver circuit provided by any embodiment of the present disclosure and (M*P)*(N*Q) fingerprint identification units arranged in an array. The fingerprint identification units are divided into M*N touch units arranged in an array, and each of the touch unit comprises P*Q fingerprint identification units arranged in an array; each of the M scanning circuits included in the driver circuit comprises P shift register units that are cascaded; M rows of touch units are in one-to-one correspondence with and connected to the M scanning circuits, and P rows of fingerprint identification units included in the each of the touch units are in one-to-one correspondence with and connected to the P shift register units that are cascaded and included in each scanning circuit; and N, P and Q are all integers greater than 1.

For example, in the touch display panel provided by an embodiment of the present disclosure, each of the fingerprint identification units comprises a driving electrode and a detection electrode; and driving electrodes of M*P rows of fingerprint identification units included in the M rows of touch units are in one-to-one correspondence with and connected to shift scanning output terminals of M*P shift register units that are cascaded and included in the M scanning circuits in the driver circuit through M*P driving lines so as to receive driving signals.

For example, in the touch display panel provided by an embodiment of the present disclosure, the touch display panel further comprises a receiving switching circuit. Detection electrodes of N*Q columns of fingerprint identification units included in N columns of touch units are connected to the receiving switching circuit through N*Q detection lines so as to transmit detection signals; and the receiving switching circuit is configured: in response to a switching control signal, to connect Q detection lines of each column of touch units to same one touch detection signal line so as to transmit detection signals output by the each column of touch units to the same one touch detection signal line, to connect Q detection lines of different columns of touch units to different touch detection signal lines so as to transmit detection signals output by the different columns of touch units to the different touch detection signal lines, and to connect Q detection lines of a selected column of touch units to different fingerprint detection signal lines so as to output detection signals output by Q columns of fingerprint identification units in the selected column of touch units to the different fingerprint detection signal lines.

For example, in the touch display panel provided by an embodiment of the present disclosure, the receiving switching circuit comprises N*Q receiving switching sub-circuits; the N*Q receiving switching sub-circuits are in one-to-one correspondence with and connected to the N*Q detection lines of the N*Q columns of fingerprint identification units; and the N*Q receiving switching sub-circuits are configured: in response to the switching control signal, to output detection signals on the Q detection lines of the each column of touch units to the same one touch detection signal line, to output detection signals on the Q detection lines of the different columns of touch units to the different touch detection signal lines, and to output detection signals on the Q detection lines of the Q columns of fingerprint identification units in the selected column of touch units to the different fingerprint detection signal lines.

For example, in the touch display panel provided by an embodiment of the present disclosure, each of the N*Q receiving switching sub-circuits comprises a first receiving switching sub-circuit and a second receiving switching sub-circuit, respectively; N*Q first receiving switching sub-circuits are connected to a first switch control line, are in one-to-one correspondence with and connected to the N*Q detection lines, and are configured to transmit detection signals on the N*Q detection lines to corresponding fingerprint detection signal lines in response to a first switching control signal provided by the first switch control line; and N*Q second receiving switching sub-circuits are connected to a second switch control line, are in one-to-one correspondence with and connected to the N*Q detection lines, and are configured to transmit detection signals on the N*Q detection lines to corresponding touch detection signal lines in response to a second switching control signal provided by the second switch control line.

For example, in the touch display panel provided by an embodiment of the present disclosure, the first switch control line and the second switch control line are same one switch control line, and a type of a transistor for implementing the first receiving switching sub-circuit and a type of a transistor for implementing the second receiving switching sub-circuit are opposite.

At least one embodiment of the present disclosure further provides a receiving switching circuit. The receiving switching circuit is configured: in response to a switching control signal, to connect Q detection lines of each column of touch units to same one touch detection signal line so as to transmit detection signals output by the each column of touch units to the same one touch detection signal line, to connect Q detection lines of different columns of touch units to different touch detection signal lines so to transmit detection signals output by the different columns of touch units to the different touch detection signal lines, and to connect Q detection lines of a selected column of touch units to different fingerprint detection signal lines so as to output detection signals output by Q columns of fingerprint identification units in the selected column of touch units to the different fingerprint detection signal lines.

For example, in the receiving switching circuit provided by an embodiment of the present disclosure, the receiving switching circuit comprises N*Q receiving switching sub-circuits; the N*Q receiving switching sub-circuits are in one-to-one correspondence with and connected to N*Q detection lines of N*Q columns of fingerprint identification units; and the N*Q receiving switching sub-circuits are configured: to output detection signals on the Q detection lines of the each column of touch units to the same one touch detection signal line in response to the switching control signal, to output detection signals on the Q detection lines of the different columns of the touch units to the different touch detection signal lines, and to output detection signals on the Q detection lines of the Q columns of the fingerprint identification units in the selected column of touch units to the different fingerprint detection signal lines.

For example, in the receiving switching circuit provided by an embodiment of the present disclosure, each of the N*Q receiving switching sub-circuits comprises a first receiving switching sub-circuit and a second receiving switching sub-circuit, respectively; N*Q first receiving switching sub-circuits are connected to a first switch control line, are in one-to-one correspondence with and connected to the N*Q detection lines, and are configured to transmit detection signals on the N*Q detection lines to corresponding fingerprint detection signal lines in response to a first switching control signal provided by the first switch control line; and N*Q second receiving switching sub-circuits are connected to a second switch control line, are in one-to-one correspondence with and connected to the N*Q detection lines, and are configured to transmit detection signals on the N*Q detection lines to corresponding touch detection signal lines in response to a second switching control signal provided by the second switch control line.

For example, in the receiving switching circuit provided by an embodiment of the present disclosure, the first switch control line and the second switch control line are same one switch control line, and a type of a transistor for implementing the first receiving switching sub-circuit and a type of a transistor for implementing the second receiving switching sub-circuit are opposite.

At least one embodiment of the present disclosure further provides a driving method of a scanning circuit provided by an embodiment of the present disclosure, which comprises: outputting, by the function switching circuit and at the control signal output terminal, the control signal to the control terminals of the plurality of shift register units that are cascaded in response to the mode switching input signal received by the mode switching input terminal; outputting, by the plurality of shift register units that are cascaded, the first output signal at the shift scanning output terminal in response to the control signal received by the control terminal; and outputting, by the function switching circuit and at the mode scanning output terminal, the second output signal to the shift scanning output terminals of the plurality of shift register units that are cascaded in response to the mode switching input signal received by the mode switching input terminal.

At least one embodiment of the present disclosure further provides a driving method of a touch display panel provided by an embodiment of the present disclosure, which comprises: in a touch phase, sequentially outputting, by the scanning circuits of the driver circuit, second output signals according to stage numbers of the scanning circuits as driving signals to the M*N touch units in response to the mode switching input signal, and determining a first function input signal line corresponding to a touch position according to detection signals provided by the M*N touch units; and in a fingerprint identification phase, determining a corresponding second function input signal line according to the first function input signal line, inputting a second function input signal provided by the second function input signal line to a corresponding scanning circuit in the driver circuit in response to the control signal, and driving the shift register units in the corresponding scanning circuit to sequentially output first output signals according to stage numbers of the shift register units as the driving signals to the fingerprint identification units in the M*N touch units.

For example, in the driving method provided by an embodiment of the present disclosure, the touch display panel further comprises a receiving switching circuit, and the driving method further comprises: in the touch phase, connecting, by the receiving switching circuit, Q detection lines of each column of touch units to same one touch detection signal line so as to transmit detection signals output by same one column of touch units to the same one touch detection signal line, and connecting, by the receiving switching circuit, Q detection lines of different columns of touch units to different touch detection signal lines so as to transmit detection signals output by the different columns of touch units to the different touch detection signal lines, in response to a switching control signal, and in the fingerprint identification phase, connecting Q detection lines of a selected column of touch units to different fingerprint detection signal lines so as to output detection signals output by the selected column of touch units to the different fingerprint detection signal lines.

At least one embodiment of the present disclosure further provides a driving method of a receiving switching circuit provided by an embodiment of the present disclosure, which comprises: connecting the Q detection lines of the each column of touch units to the same one touch detection signal line so as to transmit the detection signals output by same one column of touch units to the same one touch detection signal line, and connecting the Q detection lines of the different columns of touch units to the different touch detection signal lines so as to transmit the detection signals output by the different columns of touch units to the different touch detection signal lines, in response to the switching control signal, and connecting the Q detection lines of the selected column of touch units to the different fingerprint detection signal lines so as to output the detection signals output by the selected column of touch units to the different fingerprint detection signal lines.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
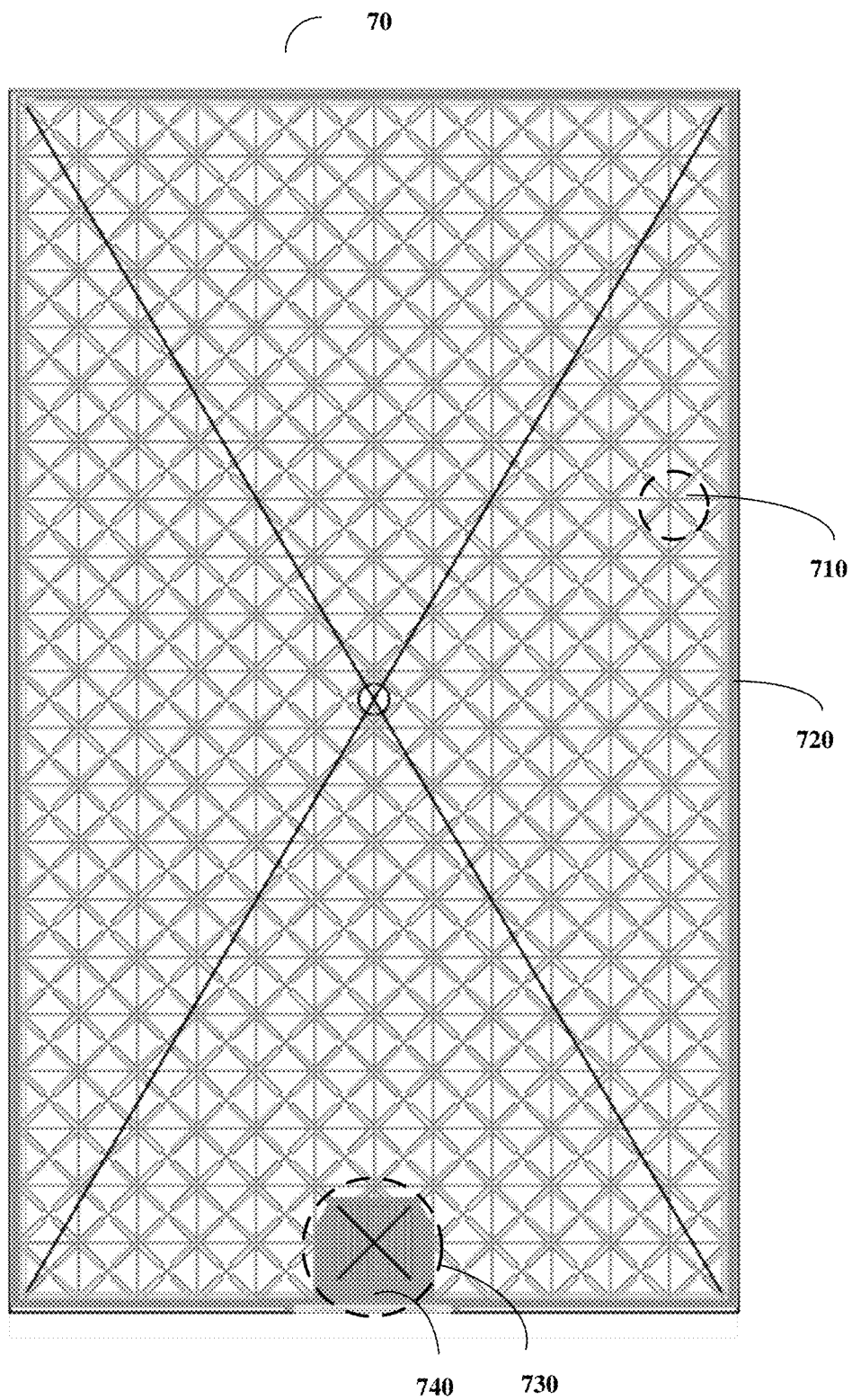
FIG. 1 is a schematic diagram of a touch display screen based on capacitive in-screen fingerprint identification.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be described below with a plurality of specific examples. In order to keep the following descriptions of embodiments of the present disclosure clear and concise, detailed descriptions of known functions and known components may be omitted. When any component of an embodiment of the present disclosure presents in more than one drawing, the component is denoted by the same or similar reference number in each drawing.

At present, fingerprint identification technology has been widely used in mobile phones, computers and other electronic devices. Moreover, with the popularization of full screens in electronic equipment, it will become an inevitable trend to apply fingerprint identification technology to the inside of display screens in the future. For example, in-screen fingerprint identification technology usually includes capacitive, optical, and ultrasonic technology. Because capacitive fingerprint identification technology has the advantages of simple manufacturing process and low cost, it is more conducive to the popularization and promotion of fingerprint identification technology.

For example, when implementing a capacitive type in-screen fingerprint identification technology, the resolution of a capacitive type touch unit is usually 5 ppi, and the resolution of the capacitive type fingerprint identification unit usually needs to reach more than 100 ppi to achieve a relatively high fingerprint identification accuracy. However, a higher resolution means that smaller fingerprint identification units and more channels for driving the fingerprint identification units are required. However, due to the limitation of the number of channels for driving the fingerprint identification units and the wiring space of the screen frame, it is difficult to realize a technology that can realize in-screen fingerprint identification at any position of the screen.

FIG. 1 is a schematic diagram of a touch display screen adopting a capacitive in-screen fingerprint identification technology. As illustrated in FIG. 1, the touch display screen 70 includes a plurality of touch units 710 and a touch control wire 720 connected to the plurality of touch units 710. For example, the touch control wire 720 is disposed in the frame region of the touch display screen 70. As illustrated in FIG. 1, the touch display screen 70 further includes a fingerprint identification unit 730. However, because the touch display screen 70 is limited by the number of channels for driving the fingerprint identification units 730 and the narrow frame of the full screen, the fingerprint identification unit 730 can only be integrated in a specific fingerprint identification area at the lower part of the screen and connected to a corresponding fingerprint identification wire 740, and cannot be integrated in the touch area (i.e., the area including the plurality of touch units 710) connected to the touch control wire 720 at the upper part of the touch display screen 70, so that fingerprint identification at any position in the display screen cannot be realized.

At least one embodiment of the present disclosure provides a scanning circuit, which comprises a function switching circuit and a plurality of shift register units that are cascaded. Each of the plurality of shift register units that are cascaded comprises a control terminal and a shift scanning output terminal, and is configured to output a first output signal at the shift scanning output terminal in response to a control signal received by the control terminal; the function switching circuit comprises a mode switching input terminal, a control signal output terminal and a mode scanning output terminal, and the control signal output terminal and the mode scanning output terminal are respectively connected to the control terminals and the shift scanning output terminals of the plurality of shift register units that are cascaded. In response to a mode switching input signal received by the mode switching input terminal, the function switching circuit is configured to output the control signal to the control terminals of the plurality of shift register units that are cascaded at the control signal output terminal or to output a second output signal to the shift scanning output terminals of the plurality of shift register units that are cascaded at the mode scanning output terminal.

At least one embodiment of the present disclosure further provides a driver circuit, a touch display panel, a receiving switching circuit and a driving method, which are corresponding to the scanning circuit.

When the scanning circuit provided by the above embodiment of the present disclosure is used for realizing a driver circuit of an electronic device with both of a touch function and an in-screen fingerprint identification function, fingerprint identification at any position in a screen can be realized without greatly increasing the number of channels for driving the fingerprint identification units; in addition, the scanning circuit is integrated with the touch function and the fingerprint identification function, and can realize arbitrary switching of the above-mentioned two functions and the cooperation of the above-mentioned two functions according to needs.

Embodiments of the present disclosure and examples thereof will be described in detail below with reference to the accompanying drawings.

Figure 2A:
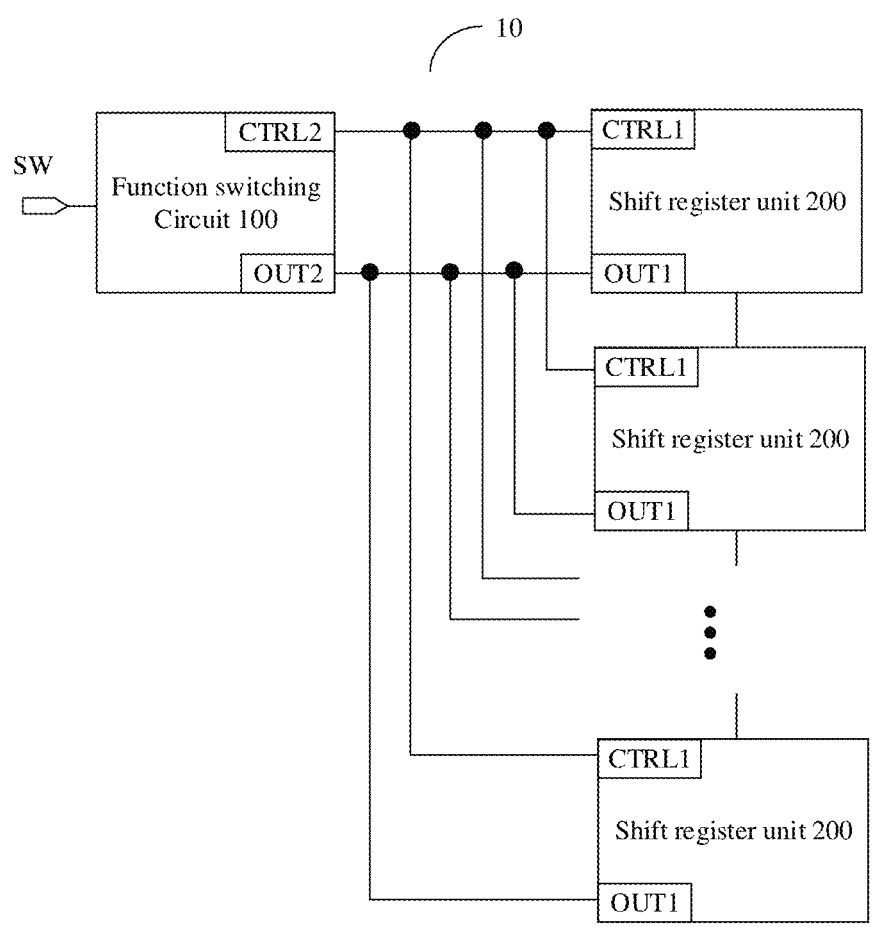
FIG. 2A is a schematic diagram of a scanning circuit provided by some embodiments of the present disclosure.
Figure 2B:
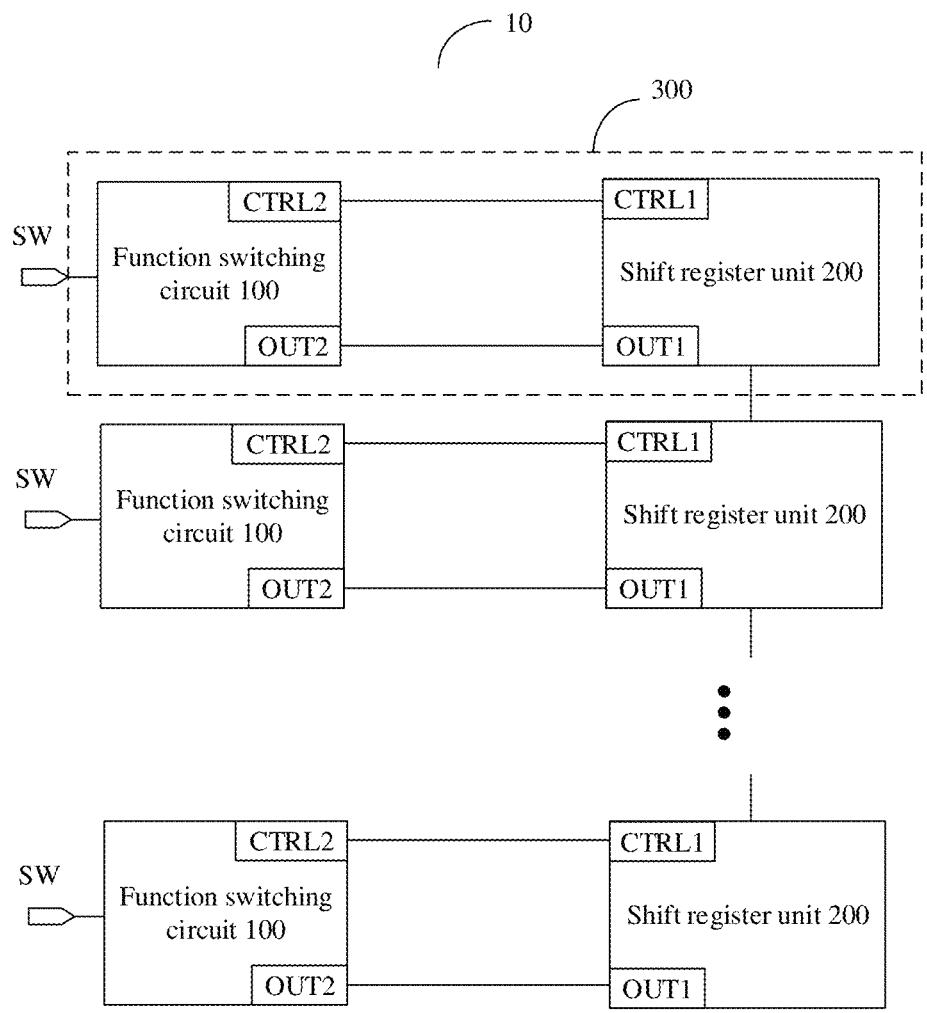
FIG. 2B is a schematic diagram of another scanning circuit provided by some embodiments of the present disclosure.

FIG. 2A is a schematic diagram of a scanning circuit provided by some embodiments of the present disclosure. FIG. 2B is a schematic diagram of another scanning circuit provided by some embodiments of the present disclosure. The scanning circuit provided by the embodiments of the present disclosure will be described in detail below with reference to FIG. 2A and FIG. 2B.

Figure 9:
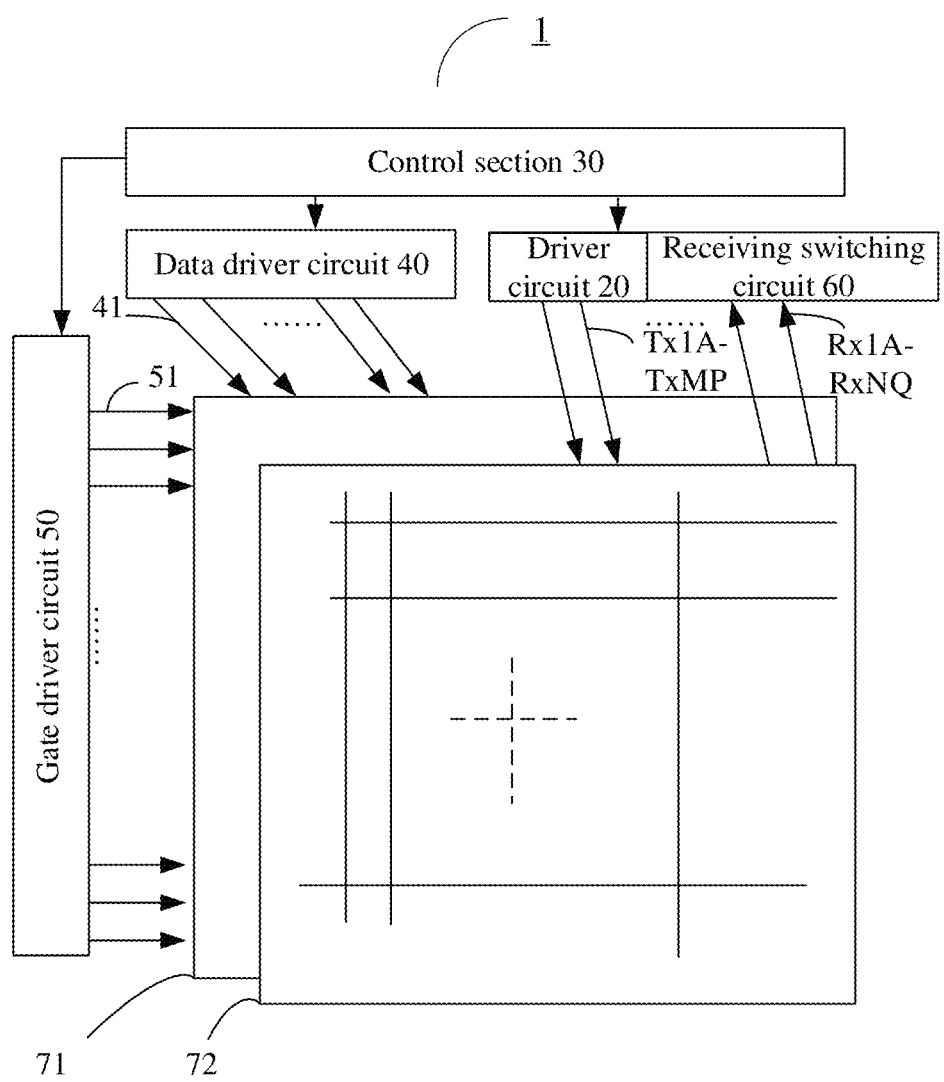
FIG. 9 is a schematic diagram of a touch display panel provided by some embodiments of the present disclosure.

As illustrated in FIG. 2A and FIG. 2B, the scanning circuit 10 comprises a function switching circuit 100 and comprises a plurality of shift register units 200 that are cascaded. For example, a driver circuit can be obtained by cascading a plurality of scanning circuits 10, and the driver circuit is used for driving, for example, a touch display panel, to sequentially provide driving signals for a plurality of rows of driving electrodes of the touch display panel so as to realize a progressive or interlaced scanning driving function, thereby realizing touch detection in a touch phase and fingerprint identification in a fingerprint identification phase. For example, the touch display panel will be described in detail in the embodiment as illustrated in FIG. 9 and will not be described here.

For example, as illustrated in FIG. 2A and FIG. 2B, each of the plurality of shift register units 200 that are cascaded comprises a control terminal CTRL1 and a shift scanning output terminal OUT1, and is configured to output a first output signal at the shift scanning output terminal OUT1 in response to a control signal received by the control terminal CTRL1.

For example, as illustrated in FIG. 2A and FIG. 2B, the function switching circuit 100 comprises a mode switching input terminal SW, a control signal output terminal CTRL2, and a mode scanning output terminal OUT2, and the control signal output terminal CTRL2 and the mode scanning output terminal OUT2 are respectively connected to the control terminal CTRL1 and the shift scanning output terminal OUT1 of the plurality of shift register units 200 that are cascaded.

For example, in response to a mode switching input signal received by the mode switching input terminal SW, the function switching circuit 100 is configured to output the control signal to the control terminals CTRL1 of the plurality of shift register units 200 that are cascaded via the control signal output terminal CTRL2, or to output a second output signal to the shift scanning output terminals OUT1 of the plurality of shift register units 200 that are cascaded via the mode scanning output terminal OUT2.

For example, in the example as illustrated in FIG. 2A, the plurality of shift register units 200 that are cascaded may share one function switching circuit 100. For example, the control signal output terminal CTRL2 and the mode scanning output terminal OUT2 of the one function switching circuit 100 are respectively connected to the control terminals CTRL1 and the shift scanning output terminals OUT1 of the plurality of shift register units that are cascaded, so as to supply the control signal output by the control signal output terminal CTRL2 of the function switching circuit 100 respectively to the control terminals CTRL1 of the plurality of shift register units 200 that are cascaded; and to supply the second output signal output by the mode scanning output terminal OUT2 of the function switching circuit 100 respectively to the shift scanning output terminals OUT1 of the plurality of shift register units 200 that are cascaded, so that the shift register units 200 in each scanning circuit 10 can simultaneously output the same second output signal to drive each touch unit in a touch mode, or shift and output the first output signal at the shift scanning output terminal OUT1 to drive each fingerprint identification unit in a fingerprint identification mode.

For example, in the example as illustrated in FIG. 2B, the scanning circuit may include a plurality of function switching circuits 100, and the plurality of function switching circuits 100 are in one-to-one correspondence with and connected to the plurality of shift register units 200 that are cascaded, and the mode switching input terminals SW of the function switching circuits 100 receive the same mode switching input signal. As illustrated in FIG. 2B, the control signal output terminal CTRL2 and the mode scanning output terminal OUT2 of a function switching circuit 100 are respectively connected to the control terminal CTRL1 and the shift scanning output terminal OUT1 of a corresponding cascaded shift register unit. For example, each scanning sub-circuit 300 may include a function switching circuit 100 and a shift register unit 200 that is in one-to-one correspondence with and connected to the function switching circuit 100. For example, the output of each scanning sub-circuit 300 is the same as the output of the shift scanning output terminal OUT1 of the shift register unit 200 included in the each scanning sub-circuit 300.

For example, the mode switching input terminals SW of the plurality of function switching circuits 100 all receive the same mode switching input signal, so that the control signal output terminals CTRL2 and the mode scanning output terminals OUT2 of the function switching circuits 100 respectively output the same control signal and the same second output signal, so that the plurality of shift register units 200 that are cascaded receive the same control signal and the same second output signal, thereby realizing the same function as that of FIG. 2A. It should be noted that the number of function switching circuits 100 may be determined according to actual conditions, for example, it may be more than one and less than the number of shift register units 200 that are cascaded, and embodiments of the present disclosure are not limited thereto.

For example, in some examples, when the mode switching input signal received by the mode switching input terminal SW is an valid level, the control signal output at the control signal output terminal CTRL2 is an invalid level, and the valid level of the second output signal is output at the mode scanning output terminal OUT2, so that, in this case, the control signals received by the control terminals CTRL1 of the plurality of shift register units 200 that are cascaded are an invalid level. Therefore, the shift scanning output terminals OUT1 of the plurality of shift register units 200 that are cascaded all output the valid level of the second output signal output by the mode scanning output terminal OUT2, thereby realizing the touch function of the touch display panel. When the mode switching input signal received by the mode switching input terminal SW is an invalid level, the control signal output by the control signal output terminal CTRL2 is an valid level, and the invalid level of the second output signal is output at the mode scanning output terminal OUT2, so that, in this case, the control signals received by the control terminals CTRL1 of the plurality of shift register units 200 that are cascaded are an valid level. Therefore, the shift scanning output terminals OUT1 of the plurality of shift register units 200 that are cascaded shifts and outputs the first output signal to a plurality of fingerprint identification units included in a touch unit of the touch display panel, thereby realizing the fingerprint identification function of the touch display panel. For example, in the present embodiment, the plurality of fingerprint identification units can be reused as a touch unit. Therefore, the function switching circuit 100 can switch the touch function and the fingerprint identification function, so that fingerprint identification at any position in the screen can be realized without greatly increasing the number of channels for driving the fingerprint identification units.

For the scanning circuit provided by the above embodiment of the present disclosure, when the scanning circuit is used for realizing a driver circuit of an electronic device with both a touch function and an in-screen fingerprint identification function, fingerprint identification at any position in the screen can be realized without greatly increasing the number of channels for driving the fingerprint identification units; in addition, the scanning circuit is integrated with the touch function and the fingerprint identification function, and can realize arbitrary switching of the above-mentioned two functions and the cooperation of the above-mentioned two functions according to needs.

Figure 3:
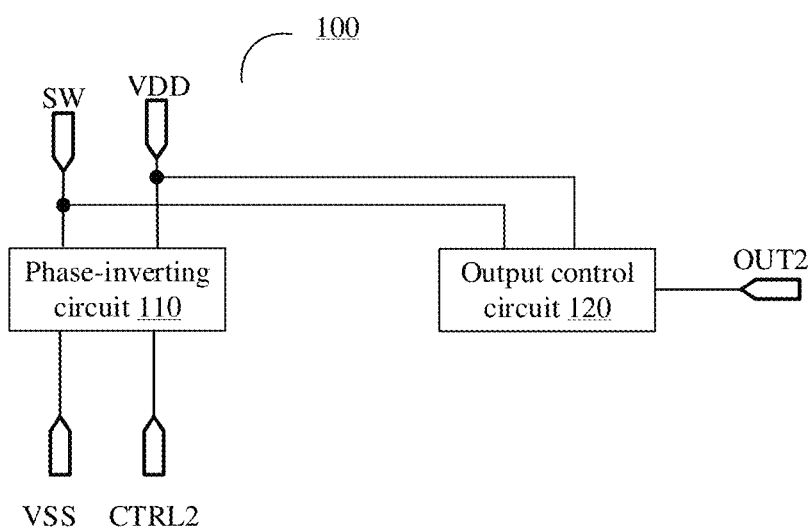
FIG. 3 is a schematic diagram of a function switching circuit provided by some embodiments of the present disclosure.

FIG. 3 is a schematic diagram of a function switching circuit provided by some embodiments of the present disclosure. For example, FIG. 3 is a schematic block diagram of the function switching circuit 100 as illustrated in FIG. 2A or FIG. 2B. For example, in the example as illustrated in FIG. 3, the function switching circuit 100 includes an phase-inverting circuit 110 and an output control circuit 120.

For example, the phase-inverting circuit 110 is connected to the mode switching input terminal SW and the control signal output terminal CTRL2, and is configured to invert the phase of the mode switching input signal received by the mode switching input terminal SW and to output the phase-inverted signal of the mode switching input signal to the control signal output terminal CTRL2, and the phase-inverted signal of the mode switching input signal is act as a control signal. For example, in some examples, the phase-inverting circuit 110 is connected to the mode switching input terminal SW, the control signal output terminal CTRL2, a first voltage terminal VSS (e.g., for providing a low level) and a second voltage terminal VDD (e.g., for providing a high level), and is configured to be turned on in response to the mode switching input signal when the mode switching input signal received by the mode switching input terminal SW is an valid level, to connect the control signal output terminal CTRL2 to the first voltage terminal VSS or a separately provided voltage terminal (e.g., a low voltage terminal), so that the first voltage provided by the first voltage terminal VSS or a low level signal provided by the separately provided voltage terminal is input to the control signal output terminal CTRL2 and acts as a control signal; when the mode switching input signal received by the mode switching input terminal SW is an invalid level, the phase-inverting circuit 110 is turned on in response to the second voltage provided by the second voltage terminal VDD, so as to connect the control signal output terminal CTRL2 to the second voltage terminal VDD, so that the second voltage provided by the second voltage terminal VDD is input to the control signal output terminal CTRL2 and acts as a control signal.

For example, the output control circuit 120 is connected to the mode switching input terminal SW and the mode scanning output terminal OUT2, and is configured to output a second output signal at the mode scanning output terminal OUT2 in response to the mode switching input signal received by the mode switching input terminal SW. For example, in some examples, the output control circuit 120 is connected to the mode switching input terminal SW, the mode scanning output terminal OUT2, and the second voltage VDD or a separately provided voltage terminal (e.g., a high voltage terminal), and is configured to be turned on in response to the mode switching input signal when the mode switching input signal received by the mode switching input terminal SW is an valid level, so as to connect the mode scanning output terminal OUT2 to the second voltage terminal VDD or the separately provided voltage terminal (e.g., a high voltage terminal), so that the second voltage provided by the second voltage terminal VDD or the high level signal provided by the separately provided voltage terminal is input to the mode scanning output terminal OUT2, and acts as a second output signal, so as to enter, for example, a touch phase in this case. When the mode switching input signal received by the mode switching input terminal SW is an invalid level, the output control circuit 120 is not turned on or is turned off, so as not to output the second output signal. In this case, because the phase-inverting circuit 110 outputs the phase-inverted signal (i.e., valid level) of the mode switching input signal as the control signal, the plurality of shift register units 200 that are cascaded are turned on in response to the control signal to realize progressive output of the first output signal, so as to enter, for example, a fingerprint identification phase in this case. Therefore, the function switching circuit 100 enables the function of the plurality of shift register units 200 that are cascaded to be switched between a touch function and a fingerprint identification function, so that fingerprint identification at any position in the screen can be realized without greatly increasing the number of channels for driving the fingerprint identification units.

Figure 4:
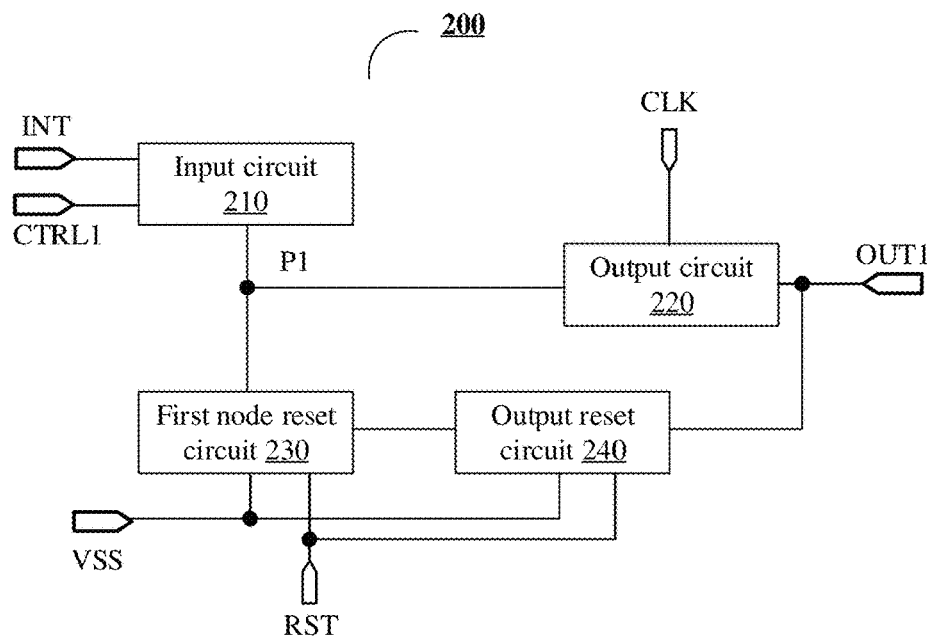
FIG. 4 is a schematic diagram of a shift register unit provided by some embodiments of the present disclosure.

FIG. 4 is a schematic diagram of a shift register unit provided by some embodiments of the present disclosure. For example, FIG. 4 is a structural block diagram of each of the plurality of shift register units 200 that are cascaded as illustrated in FIG. 2A or FIG. 2B. For example, in the example as illustrated in FIG. 4, each of the plurality of shift register units 200 that are cascaded includes an input circuit 210, an output circuit 220, a first node reset circuit 230, and an output reset circuit 240.

For example, the input circuit 210 is connected to an input terminal INT, a first node P1, and the control terminal CTRL1, and is configured to output the input signal received by the input terminal INT to the first node P1 in response to the control signal received by the control terminal CTRL1. For example, in some examples, through allowing the input circuit 210 to be connected to the input terminal INT, the first node P1 and the control terminal CTRL1, and to be configured to connect the input terminal INT and the first node P1 in response to the control signal received by the control terminal CTRL1, the input signal provided by the input terminal INT is input to the first node P1, and the potential of the first node P1 is charged (e.g., pulled up) to an operating potential (valid level).

For example, the output circuit 220 is connected to the first node P1 and the shift scanning output terminal OUT1, and is configured to output a first output signal at the shift scanning output terminal OUT1 under the control of the level of the first node P1. For example, in some examples, the output circuit 220 is connected to a first clock signal terminal CLK1, the first node P1, and the shift scanning output terminal OUT1, and is configured to be turned on under the control of the level of the first node P1, to transmit the first clock signal provided by the first clock signal terminal CLK1 to the shift scanning output terminal OUT1, and to output the first clock signal terminal CLK1 that is transmitted to the shift scanning output terminal OUT1 as a first output signal at the shift scanning output terminal OUT1.

For example, the first node reset circuit 230 is connected to a reset terminal RST and the first node P1, and is configured to reset the first node P1 in response to a reset signal received by the reset terminal RST. For example, the first node reset circuit 230 may be connected to the reset terminal RST, the first node P1, and the first voltage terminal VSS or a separately provided voltage terminal (e.g., a low voltage terminal), so that the first node reset circuit 230 can be turned on in response to the reset signal received by the reset terminal RST, and the first node P1 can be electrically connected to the first voltage terminal VSS or the separately provided low voltage terminal, so as to perform pull-down reset on the first node P1.

For example, the output reset circuit 240 is connected to the reset terminal RST and the shift scanning output terminal OUT1, and is configured to reset the shift scanning output terminal OUT in response to a reset signal received by the reset terminal RST. For example, the output reset circuit 240 may be connected to the reset terminal RST, the shift scanning output terminal OUT1, and the first voltage terminal VSS or a separately provided voltage terminal (e.g., a low voltage terminal), so that the output reset circuit 240 can be turned on in response to the reset signal received by the reset terminal RST, and the shift scanning output terminal OUT1 can be electrically connected to the first voltage terminal VSS or a separately provided low voltage terminal to perform pull-down reset on the shift scanning output terminal OUT1.

Figure 5:
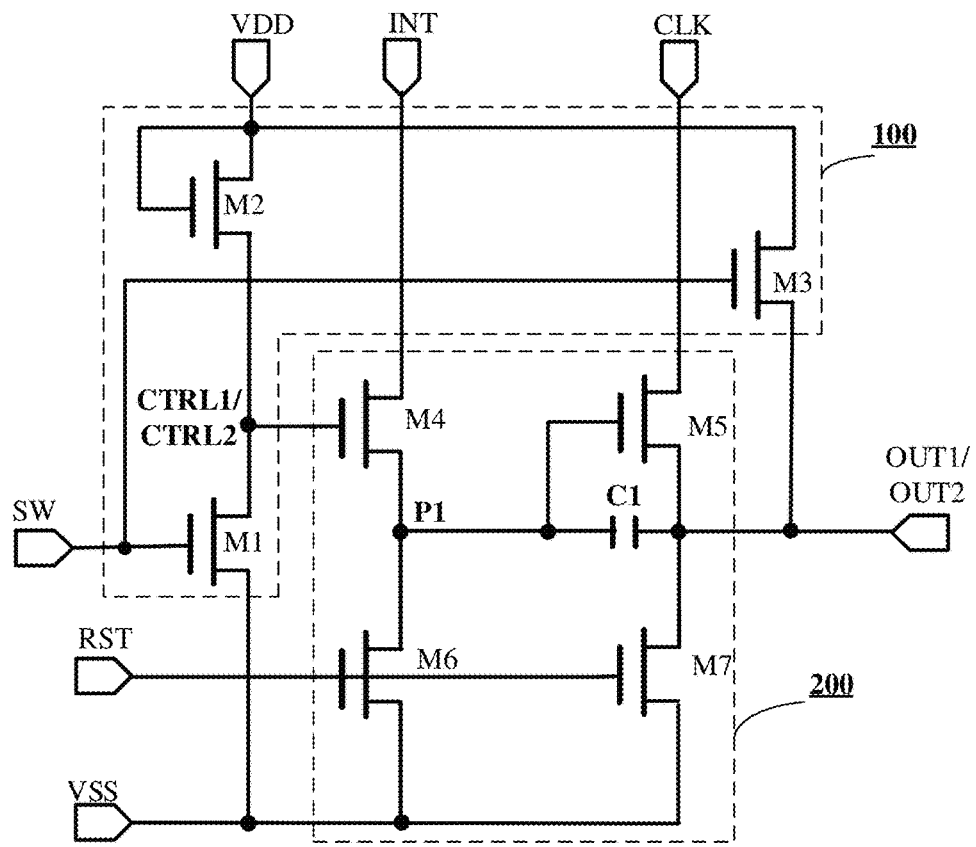
FIG. 5 is a circuit diagram of a specific implementation example of the scanning sub-circuit as illustrated in FIG. 2B.

FIG. 5 is a circuit diagram of a specific implementation example of the scanning sub-circuit as illustrated in FIG. 2B, that is, FIG. 5 illustrates a circuit diagram of a specific implementation example of the function switching circuit 100 and the shift register unit 200 as illustrated in FIG. 2B. The function switching circuit 100 and the shift register unit 200 in embodiments as illustrated in other figures may be implemented in the same or similar manner. As illustrated in FIG. 5, the function switching circuit 100 includes first to third transistors M1-M3; the shift register unit 200 includes fourth to seventh transistors M4-M7, and further includes a first capacitor C1. It should be noted that the following descriptions are given by taking the case where each transistor is an N-type transistor as an example, but this should not construe a limitation on the embodiments of the present disclosure.

For example, the phase-inverting circuit 110 may be implemented by a first transistor M1 and a second transistor M2. The gate electrode of the first transistor M1 is connected to the mode switching input terminal SW so as to receive the mode switching input signal, the first electrode of the first transistor M1 is connected to the control signal output terminal CTRL2, and the second electrode of the first transistor M1 is connected to the first voltage terminal VSS so as to receive the first voltage. The gate electrode and the first electrode of the second transistor M2 are electrically connected to each other and are both connected to the second voltage terminal VDD so as to receive the second voltage, and the second electrode of the second transistor M2 is connected to the control signal output terminal CTRL2. For example, the second transistor M2 is always in an on-state in response to the second voltage provided by the second voltage terminal VDD, so that when the first transistor M1 is turned on in response to the valid level of the mode switching input signal received by the mode switching input terminal SW, the first voltage provided by the first voltage terminal VSS is output to the control signal output terminal CTRL2; so that when the first transistor M1 is turned off in response to the invalid level of the mode switching input signal received by the mode switching input terminal SW, the second voltage provided by the second voltage terminal VDD is output to the control signal output terminal CTRL2. For example, parameters of the first transistor M1 and the second transistor M2 (e.g., the width-to-length ratio of a channel) are designed such that when the first transistor M1 is turned on in response to the valid level of the mode switching input signal received by the mode switching input terminal SW, the control signal output terminal CTRL2 is connected to the first voltage terminal VSS, so as to control the potential of the control signal output terminal CTRL2 at a first voltage (e.g., a low voltage). Therefore, the phase-inverting circuit 110 can output a phase-inverted signal of the mode switching input signal.

For example, the output control circuit 120 may be implemented as a third transistor M3. For example, the gate electrode of the third transistor M3 is connected to the mode switching input terminal SW so as to receive the mode switching input signal, the first electrode of the third transistor M3 is connected to the second voltage terminal VDD so as to receive the second voltage, and the second electrode of the third transistor M3 is connected to the mode scanning output terminal OUT2, so that when the third transistor M3 is turned on in response to the mode switching input signal provided by the mode switching input terminal SW, the mode scanning output terminal OUT2 is connected to the second voltage terminal VDD so as to output the second voltage provided by the second voltage terminal VDD as the second output signal.

For example, the input circuit 210 may be implemented as a fourth transistor M4. The gate electrode of the fourth transistor M4 is connected to the control terminal CTRL1 so as to receive a control signal, the first electrode of the fourth transistor M4 is connected to the input terminal INT so as to receive an input signal, and the second electrode of the fourth transistor M4 is connected to the first node P1, so that when the fourth transistor M4 is turned on in response to the control signal provided by the control terminal CTRL1, the input signal received by the input terminal INT charges the first node P1 to a high level. For example, in this example, because the control terminal CTRL1 is connected to the control signal output terminal CTRL2 of the function switching circuit 100, the gate electrode of the fourth transistor M4 is also connected to the control signal output terminal CTRL2 of the function switching circuit 100.

For example, the output circuit 220 may be implemented as a fifth transistor M5 and a first capacitor C1. The gate electrode of the fifth transistor M5 is connected to the first node P1, the first electrode of the fifth transistor M5 is connected to the first clock signal terminal CLK so as to receive the first clock signal as the first output signal, and the second electrode of the fifth transistor M5 is connected to the shift scanning output terminal OUT1. The first terminal of the first capacitor C1 is connected to the first node P1, and the second terminal of the first capacitor C1 is connected to the shift scanning output terminal OUT1, so that when the fifth transistor M5 is turned on under the control of the first node P1, the shift scanning output terminal OUT1 is connected to the first clock signal terminal CLK to output the first clock signal as the first output signal.

For example, the first node reset circuit 230 may be implemented as a sixth transistor M6. The gate electrode of the sixth transistor M6 is connected to the reset terminal RST so as to receive a reset signal, the first electrode of the sixth transistor M6 is connected to the first node P1, and the second electrode of the sixth transistor M6 is connected to the first voltage terminal VSS so as to receive a first voltage, so that when the sixth transistor M6 is turned on in response to the reset signal provided by the reset terminal RST, the first node P1 and the first voltage terminal VSS are connected to reset the first node P1.

For example, the output reset circuit 240 may be implemented as a seventh transistor M7. The gate electrode of the seventh transistor M7 is connected to the reset terminal RST so as to receive a reset signal, the first electrode of the seventh transistor M7 is connected to the shift scanning output terminal OUT1, and the second electrode of the seventh transistor M7 is connected to the first voltage terminal VSS so as to receive a first voltage, so that when the seventh transistor M7 is turned on in response to the reset signal provided by the reset terminal RST, the shift scanning output terminal OUT1 and the first voltage terminal VSS are connected to reset the shift scanning output terminal OUT1.

It should be noted that the circuit structures of the function switching circuit 100 and the shift register unit 200 as illustrated in FIG. 2A, FIG. 3 and FIG. 4 are similar to the circuit structure, which is illustrated in FIG. 5, of the function switching circuit 100 and the shift register unit 200 as illustrated in FIG. 2B, and no further description will be given here.

It should be noted that the "valid level" of the scanning circuit provided by the embodiments of the present disclosure refers to a level that enables a transistor, that is operated by the level, included in the scanning circuit to be turned on, and correspondingly the "invalid level" refers to a level that cannot enable a transistor, that is operated by the level, included in the scanning circuit to be turned on (i.e., the transistor is turned off). The valid level may be higher or lower than the invalid level depending on factors such as the type of transistor (N type or P type) in the circuit structure of the scanning circuit. Generally, a square wave pulse signal is used by the scanning circuit during operation, the valid level of the square wave pulse signal corresponds to the level of the square wave pulse portion of the square wave pulse signal, while the invalid level corresponds to the level of the non-square wave pulse portion of the square wave pulse signal.

For example, in the embodiments of the present disclosure, the first voltage terminal VSS is configured to provide a DC low-level signal (e.g., lower than or equal to the low-level portion of the clock signal), such as ground. The DC low-level signal is referred to as the first voltage here. The following embodiments are the same in this respect and will not be described again.

For example, the second voltage terminal VDD is configured to provide a DC high-level signal (e.g., higher than or equal to the high-level portion of the clock signal). The DC high-level signal is referred to as the second voltage here, e.g., the second voltage is greater than the first voltage.

For example, the following embodiments are the same in this respect and will not be described again.

In the embodiments of the present disclosure, for example, when each circuit is implemented as an N-type transistor, the term "pull-up" means that a node or an electrode of a transistor is charged so that the absolute value of the level of the node or the electrode increases, thereby realizing an operation (e.g., turning on) of the corresponding transistor; the term "pull-down" refers to that a node or an electrode of a transistor is discharged so that the absolute value of the level of the node or the electrode decreases, thereby realizing an operation (e.g., turning off) of the corresponding transistor.

For another example, when each circuit is implemented as a P-type transistor, the term "pull-up" means that a node or an electrode of a transistor is discharged so that the absolute value of the level of the node or the electrode decreases, thereby realizing an operation (e.g., turning on) of the corresponding transistor; the term "pull-down" means that a node or an electrode of a transistor is charged so that the absolute value of the level of the node or the electrode increases, thereby realizing an operation (e.g., turning off) of the corresponding transistor.

It should be noted that in the descriptions of the embodiments of the present disclosure, the first node P1 and the like do not represent actual components, but rather represent the junction points of related electrical connections in the circuit diagram.

It should be noted that the transistors used in the embodiments of the present disclosure can be thin film transistors or field effect transistors or other switching devices with the same characteristics, and the embodiments of the present disclosure are all described by taking the case where the transistors used in the embodiments of the present disclosure are thin film transistors as examples. The source and drain electrodes of the transistor used here can be symmetrical in structure, so the source and drain electrodes can be structurally indistinguishable. In the embodiments of the present disclosure, in order to distinguish the two electrodes of the transistor except the gate electrode, one electrode is directly described as the first electrode and the other electrode is described as the second electrode.

In addition, the embodiments of the present disclosure are described by taking the case where the transistors are all N-type transistors as examples, in which case the first electrode of the transistor is a drain electrode and the second electrode is a source electrode. It should be noted that the present disclosure includes but is not limited to this case. For example, one or more transistors in the scanning circuit 10 provided by the embodiments of the present disclosure may also adopt P-type transistors. In this case, the first electrode of the transistor is a source electrode and the second electrode is a drain electrode. All that is required is to connect the electrodes of the selected type of transistors with reference to the connections of the electrodes of the corresponding transistors in the embodiments of the present disclosure, and to make the corresponding voltage terminals provide corresponding high voltage or low voltage. When an N-type transistor is used, Indium Gallium Zinc Oxide (IGZO) can be used as the active layer of the thin film transistor. Compared with a thin film transistor using Low Temperature Poly Silicon (LTPS) or amorphous silicon (such as hydrogenated amorphous silicon) as the active layer of the thin film transistor, the size of the transistor can be effectively reduced and current leakage can be prevented.

Figure 6A:
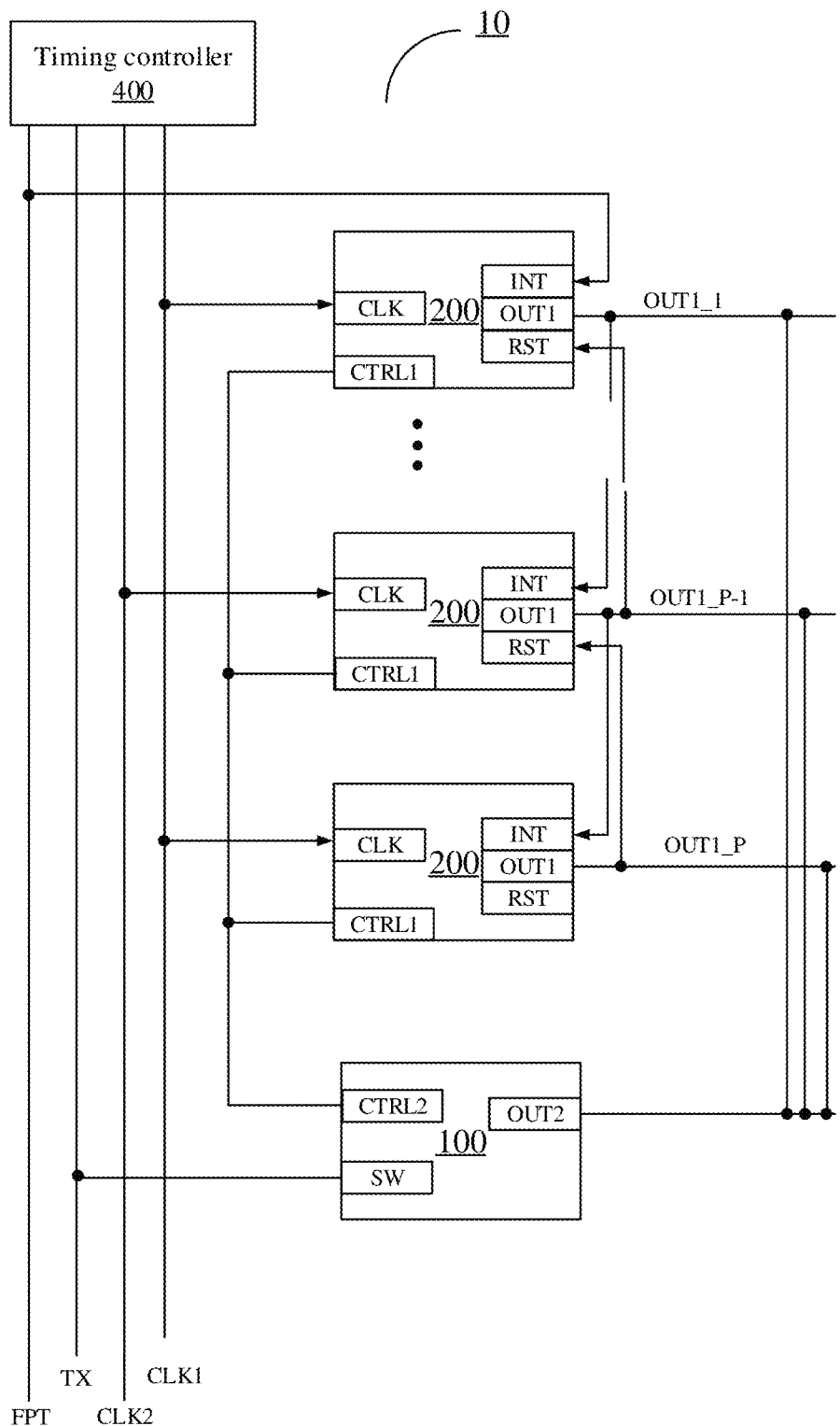
FIG. 6A is a schematic diagram of a specific implementation example of the scanning circuit as illustrated in FIG. 2A.

FIG. 6A is a schematic diagram of a specific implementation example of the scanning circuit as illustrated in FIG. 2A. As illustrated in FIG. 6A, the scanning circuit 10 includes a function switching circuit 100 and a plurality of shift register units 200 that are cascaded. For example, the function switching circuit 100 may adopt the structure of the function switching circuit 100 provided in any embodiment of the present disclosure or a variation thereof, for example, the function switching circuit 100 as illustrated in FIG. 3 may be adopted; any one or more of the shift register units 200 may adopt the structure of the shift register unit 200 provided by any embodiment of the present disclosure or a variation thereof, for example, the shift register unit 200 as illustrated in FIG. 4 may be adopted. For example, the scanning circuit 10 can be directly integrated on the array substrate of the display device using a semiconductor process same as the semiconductor process for forming the thin film transistor in the array substrate to realize progressive or interlaced scanning drive function.

For example, except for the shift register unit of the first stage, the input terminal INT of the shift register unit of each of the other stages except the first stage is connected to the shift scanning output terminal OUT1 of the shift register unit of the previous stage of the each of the other stages except the first stage. Except for the shift register unit of the last stage, the reset terminal RST of the shift register unit of each of the other stages except the last stage is connected to the shift scanning output terminals OUT1 of the shift register unit of the next stage of the each of the other stages except the last stage.

For example, the scanning circuit 10 further includes a second function input signal line FPT. For example, the input terminal INT of the shift register unit of the first stage is connected to the second function input signal line FPT so as to receive a second function input signal as an input signal.

For example, the scanning circuit 10 further includes a first function input signal line TX. For example, the mode switching input terminal SW of the function switching circuit 100 is connected to the first function input signal line TX so as to receive a first function input signal as a mode switching input signal. For example, the shift scanning output terminal OUT1 of the shift register unit of each stage is connected to the mode scanning output terminal OUT2 of the function switching circuit 100 so as to output the second output signal at the shift scanning output terminal OUT1 of the shift register unit of each stage, and the control terminal CTRL1 of the shift register unit of each stage is connected to the control signal output terminal CTRL2 of the function switching circuit 100 so as to output the control signal simultaneously to the control terminal CTRL1 of the shift register unit of each stage.

As illustrated in FIG. 6A, the scanning circuit 10 further includes a first clock signal line CLK1 and a second clock signal line CLK2. For example, the first clock signal line CLK1 and the second clock signal line CLK2 are respectively connected to clock signal terminals of the plurality of shift register units that are cascaded so as to provide clock signals. It should be noted that the scanning circuit 10 may include four, six, eight or more clock signal lines, and the number of clock signal lines can be set based on the specific situation, and no limitation is given in the embodiments of the present disclosure in this respect.

For example, as illustrated in FIG. 6A, each of the shift register units further includes a clock signal terminal CLK and is configured to be connected to the first clock signal line CLK1 or the second clock signal line CLK2 so as to receive a clock signal. For example, the clock signal terminal CLK of the shift register unit of the 2(P−1) the stage (p is an integer greater than 0) is connected to the first clock signal line CLK1, and the clock signal terminal CLK of the shift register unit of the 2(P)th stage is connected to the second clock signal line CLK2. It should be noted that the embodiments of the present disclosure include, but are not limited to, the above connection modes.

It should be noted that "OUT1_1" as illustrated in FIG. 6A represents the shift scanning output of the shift register unit of the first stage, "OUT1_P−1" represents the shift scanning output of the shift register unit of the (P−1)th stage, "OUT1_P" represents the shift scanning output of the shift register unit of the (P)th stage, and so on. The reference signs in the following embodiments are similar to this and no further description will be given here.

For example, the reset terminal RST of the shift register unit of the last stage may be configured to receive a reset signal, which is not shown in FIG. 6A for the sake of brevity.

For example, as illustrated in FIG. 6A, the scanning circuit 10 may further include a timing controller 400. For example, the timing controller 400 may be configured to be connected to the first clock signal line CLK1, the second clock signal line CLK2, the first function input signal line TX, and the second function input signal line FPT so as to provide clock signals to the shift register units and to input the first function input signal and the second function input signal to the function switching circuit. For example, the timing controller 400 may further be configured to provide a reset signal. It should be noted that the phase relationship between a plurality of clock signals provided by the timing controller 400 can be determined according to actual requirements.

Figure 6B:
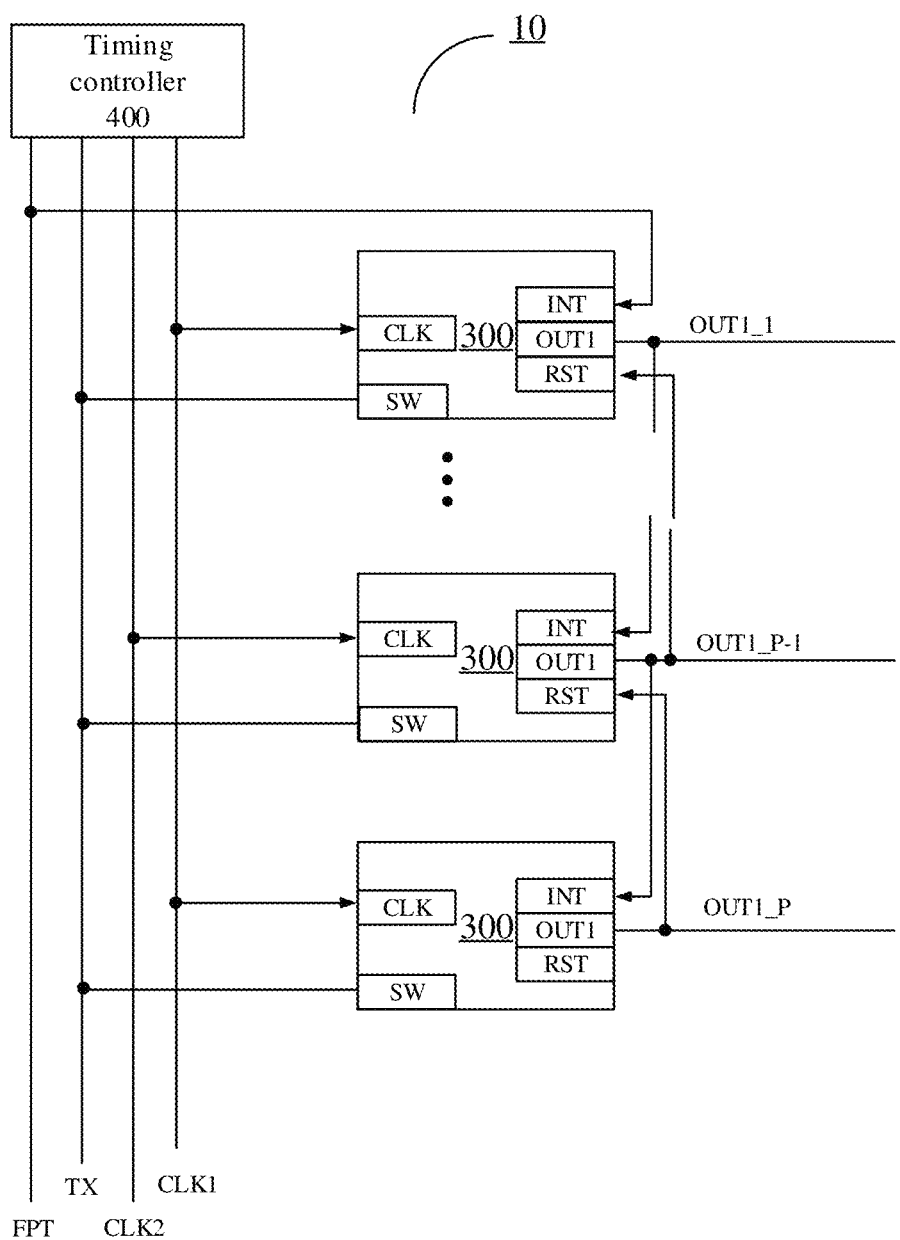
FIG. 6B is a schematic diagram of a specific implementation example of the scanning circuit as illustrated in FIG. 2B.

FIG. 6B is a schematic diagram of a specific implementation example of the scanning circuit as illustrated in FIG. 2B. The structure of the scanning circuit as illustrated in FIG. 6B is similar to that of the scanning circuit as illustrated in FIG. 6A, except that the scanning circuit 10 as illustrated in FIG. 6B includes a plurality of scanning sub-circuits 300, which is illustrated in FIG. 2B, that are cascaded. For example, as illustrated in FIG. 2B, each scanning sub-circuit 300 includes a function switching circuit 100 and a shift register unit 200, and no further description will be given here.

For example, in the example as illustrated in FIG. 6B, the mode switching input terminal SW of the scanning sub-circuit 300 of each stage is electrically connected to the first function input signal line TX, so as to receive a first function input signal as a mode switching input signal.

For example, the working mechanism of each scanning sub-circuit in the scanning circuit 10 as illustrated in FIG. 6A or FIG. 6B is as follows:

When the mode switching input signal received by the mode switching input terminal SW is a high level and the reset signal received by the reset terminal RST is a low level, the first transistor M1, the fourth transistor M4, the sixth transistor M6 and the seventh transistor M7 are turned off, and the third transistor M3 is turned on, so that the shift scanning output terminal OUT1 outputs a high level;

When the mode switching input signal received by the mode switching input terminal SW is a low level and the reset signal received by the reset terminal RST is a low level, the first transistor M1 and the fourth transistor M4 are turned on, and the sixth transistor M6, the seventh transistor M7 and the third transistor M3 are turned off; when the input terminal INT inputs a high level, the fifth transistor M5 is turned on; thus, when the clock signal terminal CLK is a high level, the shift scanning output terminal OUT1 outputs a high level;

When the reset signal received by the reset terminal RST is a high level, the sixth transistor M6 and the seventh transistor M7 are turned on, and the shift scanning output terminal OUT1 outputs a low level.

It should be noted that the working mechanism of the previous and next scanning sub-circuits 300 included in the scanning circuit will be described in detail below and no further description will be given here.

Figure 7:
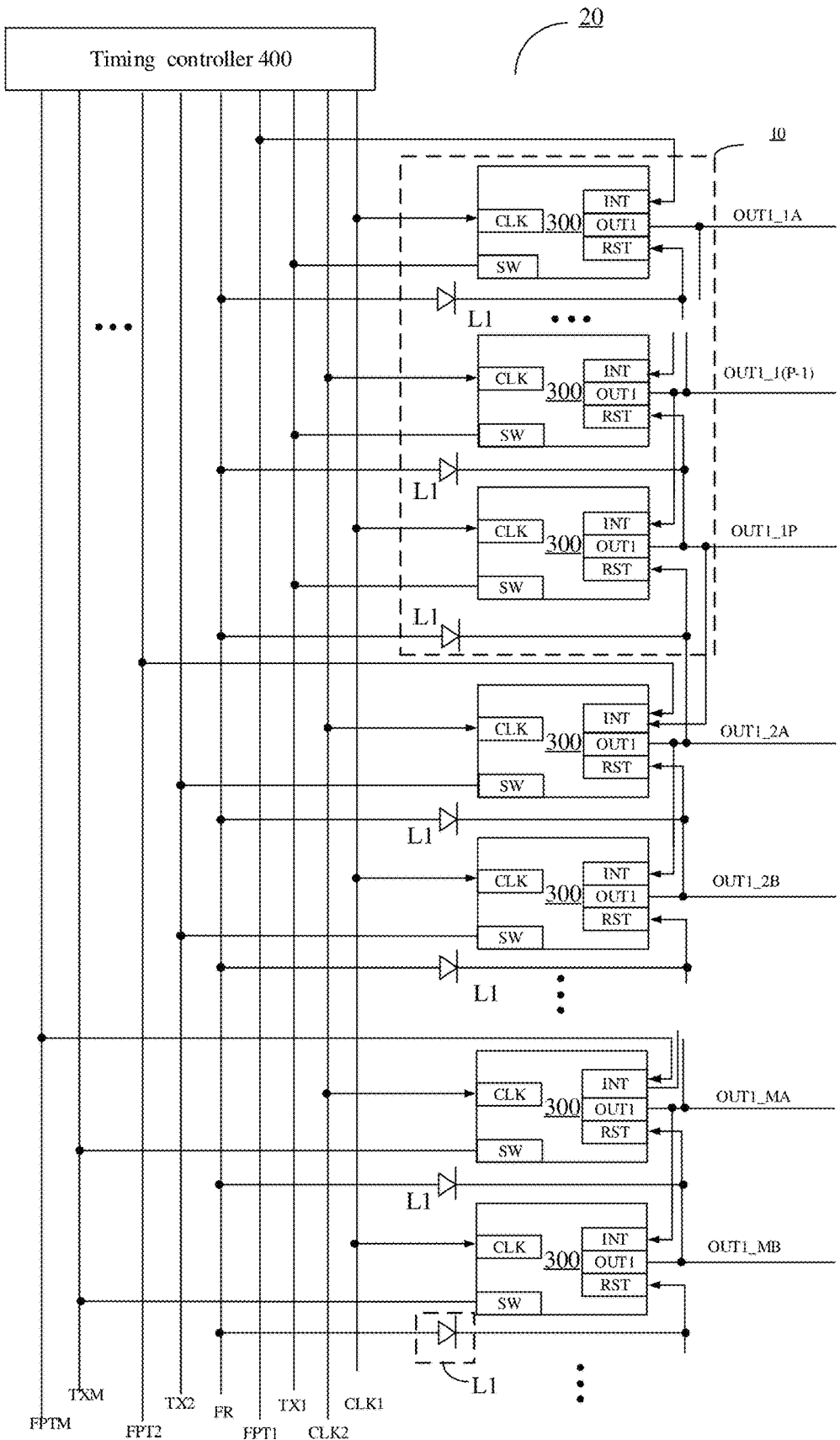
FIG. 7 is a schematic diagram of a driver circuit provided by some embodiments of the present disclosure.

Some embodiments of the present disclosure further provide a driver circuit. FIG. 7 is a schematic diagram of a driver circuit provided by some embodiments of the present disclosure. As illustrated in FIG. 7, the driver circuit 20 includes M (M is an integer greater than 1) scanning circuits 10 that are cascaded, in which any one or more of the scanning circuits may adopt the structure of the scanning circuit 10 provided in any embodiment of the present disclosure or a variation thereof. For example, in the example as illustrated in FIG. 7, the case where the scanning circuit 10 as illustrated in FIG. 6B is adopted is taken as an example for explanation. For example, each scanning circuit 10 includes P scanning sub-circuits 300 that are cascaded, and the driver circuit 20 includes M*P scanning sub-circuits 300 that are cascaded. For example, the structure of the driver circuit including the function switching circuit 100 and the shift register unit 200 provided by other embodiments is similar to this and will not be described here again. For example, the driver circuit 20 can be directly integrated on the array substrate of the display device using a semiconductor manufacturing process same as the semiconductor manufacturing process for forming the thin film transistor of the array substrate to realize the function of scanning and driving the touch display panel.

As illustrated in FIG. 7, the driver circuit 20 further includes M first function input signal lines TX1, TX2, . . . , TXM and M second function input signal lines FPT1, FPT2, . . . , FPTM.

For example, as illustrated in FIG. 7, the 1st first function input signal line TX1 is connected to the mode switching input terminal SW of the function switching circuit 100 in the scanning sub-circuit 300 of each stage in the scanning circuit of the first stage, so as to provide a first function input signal as a mode switching input signal, and the 1st second function input signal line FPT1 is connected to the input terminal INT of the shift register unit of the scanning sub-circuit 300 of the first stage in the scanning circuit of the first stage, so as to provide a second function input signal. The x-th (x is an integer greater than or equal to 1 and less than or equal to M) first function input signal lines TXx are connected to the mode switching input terminal SW of the function switching circuit 100 in the scanning sub-circuit 300 of each stage in the scanning circuit 10 of the x-stage, so as to provide a first function input signal as a mode switching input signal, and the x-th second function input signal lines FPTx are connected to the input terminal INT of the shift register unit of the scanning sub-circuit 300 of the first stage in the scanning circuit of the x-stage, so as to provide a second function input signal; the M-th first function input signal line TXM is connected to the mode switching input terminal SW of the function switching circuit 100 in the scanning sub-circuit 300 of each stage in the scanning circuit 10 of the M-th stage, so as to provide a first function input signal as a mode switching input signal, and the M-th second function input signal line FPTM is connected to the input terminal INT of the shift register unit of the scanning sub-circuit 300 of the first stage in the scanning circuit of the M-th stage, so as to provide a second function input signal.

For example, the driver circuit 20 may further include a first function scanning circuit (not shown in the figure). For example, the above M first function input signal lines TX1, TX2, . . . , TXM are connected to a plurality of output terminals of the first function scanning circuit, based on one-to one correspondence, so as to receive a plurality of output signals shifted and output from the first function scanning circuit as first function input signals. For example, the first function scanning circuit may be a circuit having a structure similar to that of the scanning circuit 10, as long as the circuit can satisfy the requirement that the first function input signal can be shifted and output, and no limitation will be given in the embodiments of the present disclosure in this respect.

For example, as illustrated in FIG. 7, in the embodiments of the present disclosure, the input terminal INT of the shift register unit of the first stage of the scanning circuit of the x-th stage may be connected to the shift scanning output terminal OUT1 of the shift register unit of the scanning sub-circuit 300 of the last stage of the scanning circuit 10 of the (x−1)-th (x is an integer greater than or equal to 2 and less than or equal to M) stage, in addition to being connected to the x-th second function input signal line FPTx so as to receive the second function input signal; the reset terminal RST of the shift register unit of the scanning sub-circuit 300 of the last stage of the scanning circuit of the x-th stage is connected to the shift scanning output terminal OUT1 of the shift register unit of the scanning sub-circuit 300 of the first stage of the scanning circuit 10 of the (x+1)-th stage. For example, the cascading relationship of scanning sub-circuits in the scanning circuit 10 of each stage can refer to FIG. 6B and no further description will be given here.

As illustrated in FIG. 7, the driver circuit 20 may further include a reset signal line FR and a plurality of unidirectional input circuits L1. For example, the reset signal line FR is connected to the reset terminals RST of each shift register unit of the scanning circuit of each stage respectively through the plurality of unidirectional input circuits L1, so as to provide an overall reset signal. For example, the input terminals of the plurality of unidirectional input circuits L1 are connected to the reset signal line FR, and the output terminals of the plurality of unidirectional input circuits L1 are connected, based on one-to one correspondence, to the reset terminals RST of the plurality of shift register units 200 that are cascaded in the plurality of scanning circuits 10, so that when the output signal output by the shift register unit of the next stage is served as the reset signal of the shift register unit of the current stage, the reset signal can be prevented from being input to the reset signal line FR so as to reset all the shift register units.

For example, each of the plurality of unidirectional input circuits L1 includes a diode. For example, the first electrode of the diode L1 is connected to the reset signal line FR, and the second electrode of the diode L1 is connected to the reset terminal RST of a shift register unit.

It should be noted that "OUT1_1A" as illustrated in FIG. 7 represents the shift scanning output terminal of the shift register unit of the scanning sub-circuit 300 of the first stage of the scanning circuit of the first stage, "OUT1_1(P−1)" represents the shift scanning output terminal of the shift register unit of the scanning sub-circuit 300 of the (P−1)th stage of the scanning circuit of the first stage, and OUT1_1P represents the shift scanning output terminal of the shift register unit of the scanning sub-circuit 300 of the (P)th stage of the scanning circuit of the first stage; OUT1_2A represents the shift scanning output terminal of the shift register unit of the scanning sub-circuit 300 of the first stage of the scanning circuit of the second stage, OUT1_2B represents the shift scanning output terminal of the shift register unit of the scanning sub-circuit 300 of the second stage of the scanning circuit of the second stage, and so on. OUT1_MA represents the shift scanning output terminal of the shift register unit of the scanning sub-circuit 300 of the first stage of the scanning circuit of the (M)th stage, OUT1_MB represents the shift scanning output terminal of the shift register unit of the scanning sub-circuit 300 of the second stage of the scanning circuit of the (M)th stage, and so on. The reference signs in the following embodiments are similar to this and no further description will be given here.

For example, as illustrated in FIG. 7, the driver circuit 20 may further include a timing controller 400. For example, the timing controller 400 may be configured to be connected to the first clock signal line CLK1 and the second clock signal line CLK2 so as to provide clock signals to the shift register units; the timing controller 400 may further be configured to be connected to the reset signal line FR so as to provide reset signals to the shift register units 100, respectively. For example, the timing controller 400 may further be configured to be connected to M first function input signal lines TX1, TX2, . . . , TXM and M second function input signal lines FPT1, FPT2, . . . , FPTM so as to provide a first function input signal and a second function input signal to the function switching circuit and the shift register unit in the scanning sub-circuit 300 of each stage. It should be noted that the phase relationship among the plurality of clock signals, the first function input signal and the second function input signal, which are provided by the timing controller 400 may be determined according to actual requirements.

Figure 8:
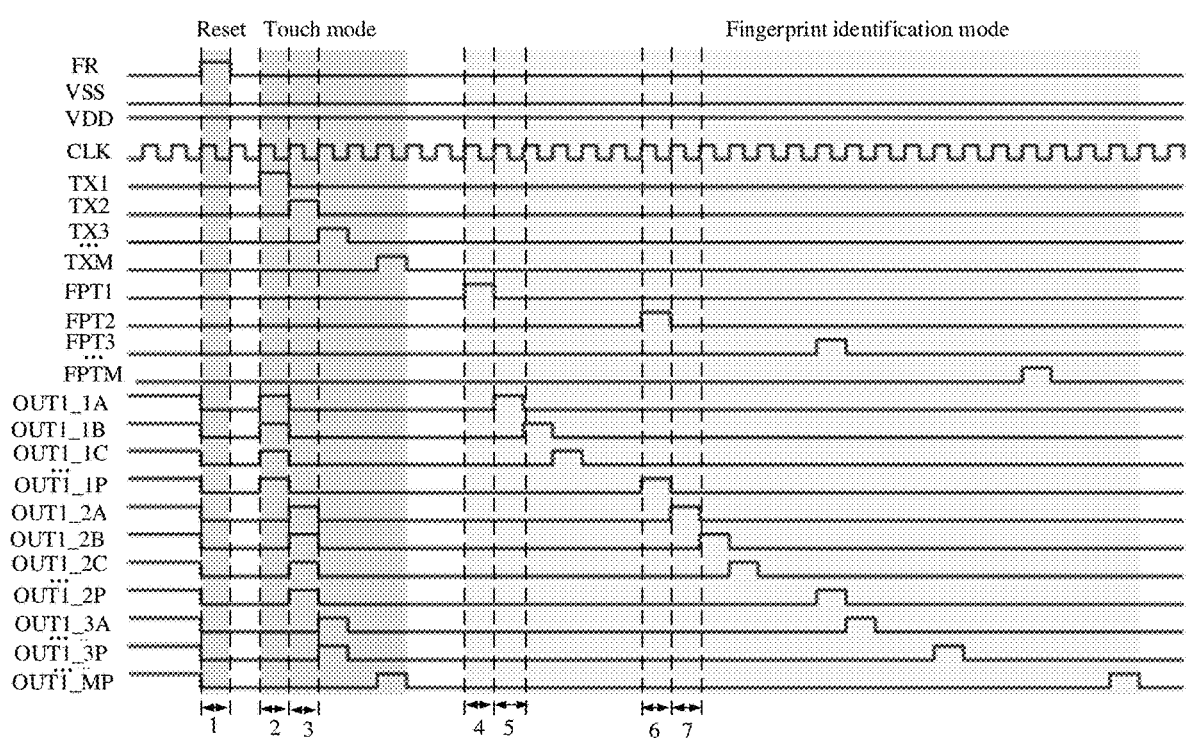
FIG. 8 is a signal timing sequence diagram corresponding to the driver circuit as illustrated in FIG. 7 in operation provided by some embodiments of the present disclosure.

For example, the timing of the clock signal received by the clock signal terminal CLK, the first function input signals provided by the M first function input signal lines TX1, TX2, . . . , TXM, and the second function input signals provided by the M second function input signal lines FPT1, FPT2, . . . , FPTM may adopt the signal timing sequence as illustrated in FIG. 8 so as to allow the driver circuit 20 to realize the functions of driving the touch unit and the fingerprint identification unit, respectively. It should be noted that the amplitude of the potential in the signal timing sequence diagram as illustrated in FIG. 8 is only schematic and does not represent the true potential value or relative proportion. For the above example, the high level signal corresponds to the on signal of the N-type transistor, while the low level signal corresponds to the off signal of the N-type transistor.

FIG. 8 is a signal timing sequence diagram, provided by some embodiments of the present disclosure, corresponding to the driver circuit, in operation, as illustrated in FIG. 7. For example, in one example, the working mechanism of the scanning circuit of the driver circuit 20 as illustrated in FIG. 7 will be described below with reference to the signal timing sequence diagram as illustrated in FIG. 8.

In a first stage 1 (i.e., in a reset stage): the reset signal line FR provides a high level. Because the reset terminals RST of the shift register units of each stage are all connected to the reset signal line FR, in this stage, the first node reset circuits 230 and the output reset circuits 240 of the shift register units of each stage are all turned on, so that the first nodes P1 and the shift scanning output terminals OUT1_1A-OUT1_MP are all connected to the first voltage terminal VSS, thereby resetting the first nodes P1 and the shift scanning output terminals OUT1_1A-OUT1_MP of the shift register units of each stage. For example, the reset signal provided by the reset signal line FR can reset all shift register units at the same time.

For example, in the touch mode, the reset signal line FR provides a low level, and the reset terminals RST of the shift register units are input with a low level; M first function input signal lines TX1, TX2, . . . , TXM sequentially provide high levels, thereby sequentially driving the scanning circuit of the first stage, the scanning circuit of the second stage, . . . and the scanning circuit of the (M)th stage and allowing the scanning circuit of the first stage, the scanning circuit of the second stage, . . . and the scanning circuit of the (M)th stage to sequentially output high levels to form drive scanning signals for the touch unit.

The working mechanism of the scanning circuit of the first stage and the scanning circuit of the second stage in the driver circuit 20 in the touch mode will be described in detail below.

In the second stage 2, the $1^{st}$ first function input signal line TX1 inputs a high level. Because the mode switching input terminals SW of the function switching circuits 100 of the P scanning sub-circuits 300 in the scanning circuit 10 of the first stage are all connected to the $1^{st}$ first function input signal line TX1, the mode switching input terminals SW receives the high level provided by the first function input signal line TX1 as a mode switching input signal in this stage. In this stage, the first transistor M1 in the phase-inverting circuit 110 in the function switching circuit 100 in the scanning sub-circuit 300 of each stage in the scanning circuit 10 of the first stage is turned on in response to the mode switching input signal, so that the control output terminal CTRL2 is connected to the first voltage terminal VSS so as to receive the first voltage as the control signal, and therefore, the input circuit 210 of the shift register unit 200 is turned off in response to the first voltage. However, the output control circuit 120 in the function switching circuit 100 of the scanning sub-circuits 300 in the scanning circuit 10 of the first stage is turned on in response to the mode switching input signal, so that the second voltage terminal VDD is connected to the mode scanning output terminal OUT2. Because the shift scanning output terminal OUT1 is connected to the mode scanning output terminal OUT2, in this stage, the shift scanning output terminals OUT1_1A-OUT1_1P in the P scanning sub-circuits 300 in the scanning circuit 10 of the first stage all output high levels.

In the third stage 3, the $2^{nd}$ first function input signal line TX2 inputs a high level. Because the mode switching input terminals SW of the function switching circuits 100 of the P scanning sub-circuits 300 in the scanning circuit 10 of the second stage are all connected to the $2^{nd}$ first function input signal line TX1, the mode switching input terminals SW receive the high level provided by the first function input signal line TX1 as a mode switching input signal in this stage. Therefore, in this stage, the shift scanning output terminals OUT1_2A-OUT1_2P of the P scan sub-circuits 300 in the scanning circuit 10 of the second stage all output high levels. The specific process can refer to detailed descriptions of the second stage 2 and no further description will be given here.

It should be noted that the working mechanism of the scanning circuits 10 of other stages is similar to the working mechanism, which is described above, of the scanning circuit of the first stage, and no further description will be given here.

In the fingerprint identification mode, M first function input signal lines TX1, TX2, . . . , TXM are all input low levels. For example, in the touch mode, a first function input signal line TXx corresponding to a touch position is located through a touch function, a corresponding second function input signal line FPTx is determined according to the first function input signal line TXx, and a high level is input to the second function input signal line FPTx so as to turn on a shift register unit in the scanning sub-circuit 300 of the first stage of the scanning circuit of the x-th stage, the shift register unit in the scanning sub-circuit 300 of the first stage provides an input signal to the shift register unit of the next stage and a reset signal to the shift register unit of the previous stage, while driving the first row of fingerprint identification channels. Output signals sequentially output by the shift register units in the scanning sub-circuit of each stage form fingerprint identification scanning driving signals.

The following description will be given by taking the working mechanism of the scanning circuit of the first stage and the scanning circuit of the second stage in the fingerprint identification mode as an example, and the embodiments of the present disclosure are not limited thereto.

In the fourth stage 4, if the touch position is at the position driven by the scanning circuit 10 of the first stage, the $1^{st}$ second function input signal line FPT1 inputs a high level. Because the input terminal INT of the shift register unit 200 in the scanning sub-circuit 300 of the first stage in the scanning circuit 10 of the first stage is connected to the $1^{st}$ second function input signal line FPT1, the input terminal INT of the shift register unit 200 receives the high level provided by the second function input signal line FPT1 as an input signal in this stage. In the fingerprint identification operation mode, M first function input signal lines TX1, TX2, . . . , TXM all input low levels, that is, the mode switching input terminals SW receive a low level mode switching input signal. Thus, in this stage, the first transistor M1 in the phase-inverting circuit 110 of the function switching circuit 100 in the scanning sub-circuit 300 of the scanning circuit 10 of the first stage is turned off in response to the mode switching input signal. As such, the control output terminal CTRL2 is connected to the second voltage terminal VDD so as to receive the second voltage as a control signal. Therefore, the input circuit 210 of the shift register unit 200 is turned on in response to the second voltage, thereby charging the first node P1 with the high level provided by the $1^{st}$ second function input signal line FPT1 so as to charge the first node P1 to the first high level. Because the clock signal terminal CLK receives the clock signal of low level in this stage, the shift register unit of the first stage 200 outputs, at the shift scanning output terminal OUT1_1A, the low level received by the clock signal terminal CLK under the control of the first high level of the first node P1.

In the fifth stage 5, the clock signal terminal CLK receives a clock signal of high level, and the first node P1 is further charged to a second high level due to the bootstrap effect of the capacitor. Therefore, under the control of the second high level of the first node P1, the high level received by the clock signal terminal CLK is output to the shift scanning output terminal OUT1_1A of the shift register unit of the first stage 200.

Because the shift scanning output terminal OUT1_1A of the shift register unit 200 of the first stage is connected to the input terminal INT of the shift register unit of the second stage, the first node P1 of the shift register unit of the second stage is pulled up to the first level in this stage, and so on, thereby sequentially realizing shifting and outputting high levels by the shift scanning output terminals OUT1_1A-OUT1_1P of the P shift register units in the scanning circuit of the first stage.

In the sixth stage 6, if the touch position is at the position driven by the scanning circuit of the second stage, the $2^{nd}$ second function input signal line FPT2 inputs a high level. Because the input terminal INT of the shift register unit 200 of the first stage in the scanning sub-circuit 300 of the second stage in the scanning circuit of the second stage 10 is connected to the $2^{nd}$ second function input signal line FPT1, in this stage, the input terminal INT of the shift register unit 200 receives the high level provided by the second function input signal line FPT1 as an input signal, so as to realize the shifting and outputting of the shift register units in the scanning circuit 10 of the second stage. The specific process can refer to detailed descriptions of the fifth stage 5 and no further description will be given here.

For example, in this stage, because the input terminal INT of the shift register unit of the first stage of the scanning circuit of the second stage is further connected to the shift scanning output terminal OUT1_1P of the shift register unit of the last stage of the scanning circuit of the first stage, even if the $2^{nd}$ second function input signal line FPT2 inputs a low level, the shifting and outputting of the shift register unit of each stage in the scanning circuits 10 of the second stage to M-th stage can also be realized, thereby realizing the fingerprint identification function.

It should be noted that the working mechanism of the scanning circuits 10 of other stages is similar to the working mechanism, which is described above, of the scanning circuit of the first stage and no further description will be given here.

The technical effect of the driver circuit 20 provided by the embodiments of the present disclosure can refer to the corresponding description of the scanning circuit 10 in the above embodiments, and no further description will be given here.

Figure 10A:
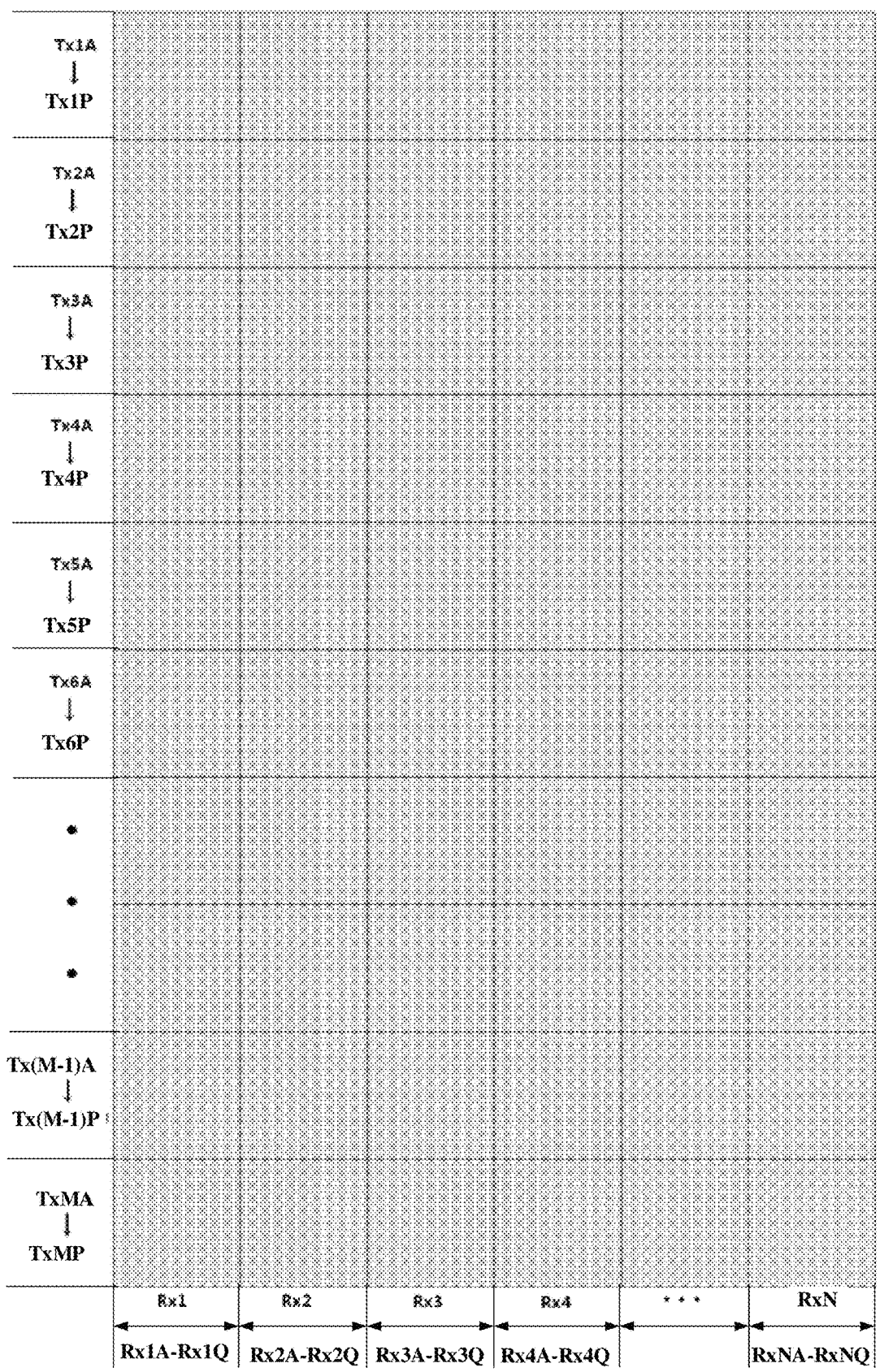
FIG. 10A is a schematic diagram of touch units arranged in an array according to some embodiments of the present disclosure.

FIG. 9 is a schematic diagram of a touch display panel according to some embodiments of the present disclosure, and FIG. 10A is a schematic diagram of touch units arranged in an array according to some embodiments of the present disclosure. As illustrated in FIG. 9, the touch display panel 1 includes the driver circuit 20 provided in any of the above embodiments of the present disclosure and (M*P)*(N*Q) fingerprint identification units arranged in an array (N, P and Q are all integers greater than 1) (as illustrated in FIG. 10A), i.e., the array of fingerprint identification units includes (M*P) rows and (N*Q) columns.

As illustrated in FIG. 9, the touch display panel 1 further includes a control section 30, a data driver circuit 40, a gate driver circuit 50, a receiving switching circuit 60, a liquid crystal display panel 71, and a touch detection panel 72. For example, the touch detection panel 72 includes (M*P)*(N*Q) fingerprint identification units arranged in an array (N, P and Q are all integers greater than 1), and the liquid crystal display panel 71 includes a pixel array (not shown in the figure) arranged in an array.

Figure 10B:
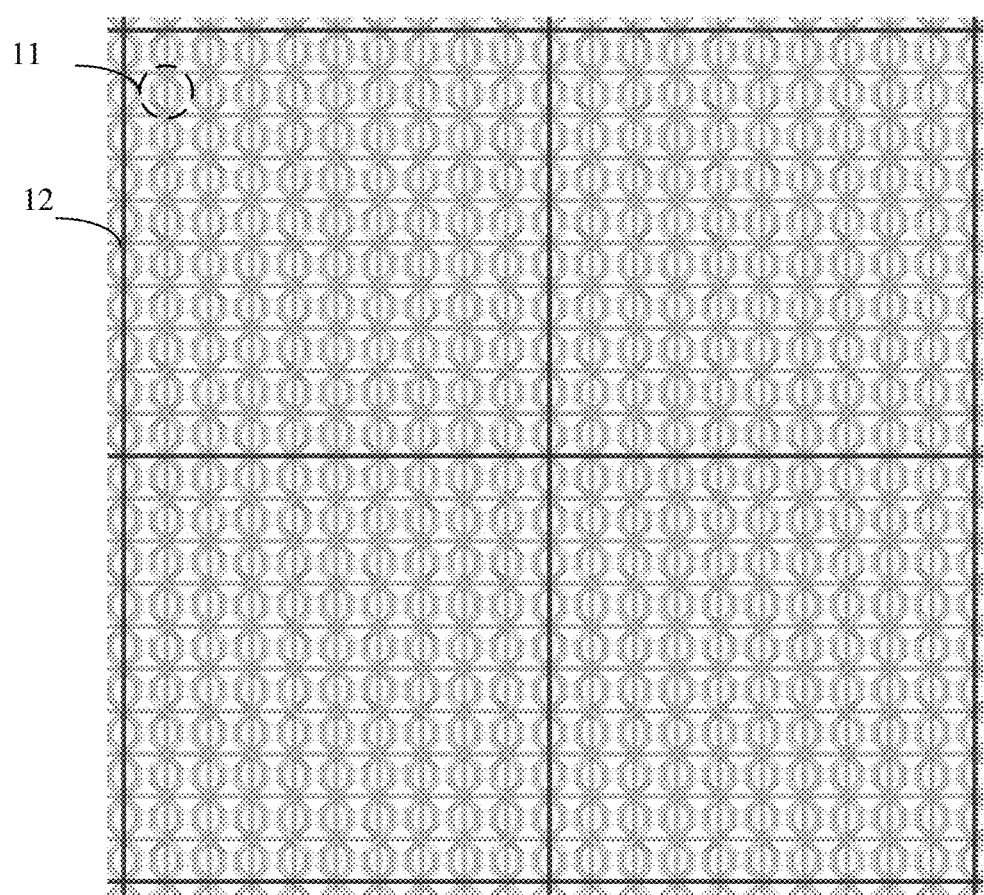
FIG. 10B is a schematic diagram of a specific implementation example of the touch units as illustrated in FIG. 10A.

For example, as illustrated in FIGS. 9, 10A and 10B, the fingerprint identification units 11 included in the touch detection panel 72 are divided into M*N touch units 12 arranged in an array, and each touch unit 12 includes P*Q fingerprint identification units 11 arranged in an array, i.e., P*Q fingerprint identification units 11 are used as one touch unit 12. For example, the touch detection panel 72 may be a mutual-capacitive type touch sensor or a self-capacitive type touch sensor, and no limitation will be given in the embodiments of the present disclosure in this respect.

For example, each of the M scanning circuits 10 included in the driver circuit 20 includes P shift register units 200 that are cascaded; M rows of touch units 12 are in one-to-one correspondence with and connected to M scanning circuits 10. For example, the P rows of fingerprint identification units 11 included in each touch unit 12 are in one-to-one correspondence with and connected to the shift scanning output terminals of the P shift register units 200 that are cascaded included in each scanning circuit 10 through driving lines Tx1A-TxMP.

In an example, the touch detection panel 72 is a mutual-capacitive type touch sensor, for example, each fingerprint identification unit 11 includes a driving electrode and a detection electrode (a driving electrode extending transversely and a detection electrode extending longitudinally as illustrated in the figure), in which the driving electrode and the detection electrode are intersected and insulated from each other, and a detection capacitor is formed at the overlap position of the driving electrode and the detection electrode. When, for example, a person's finger contacts the detection capacitor, because the finger is a conductor and grounded, the capacitance value of the detection capacitor is caused to change, the driving signal input by the driving electrode is coupled out via the detection electrode as a detection signal, and the detection signal can also change accordingly, then whether touch exists and the position of the touch can be determined through detecting the output signal. In addition, there are concave and convex surfaces such as ridges and valleys in a person's fingerprint, and the distance between the concave surface and the detection capacitor at the contact position and the distance between the convex surface and the detection capacitor at the contact position are different, and therefore, the concave surface and the convex surface have different effects on the detection capacitors, thus makes the change of the capacitance value of the detection capacitors different. Therefore, by detecting the change of the capacitance values, it is further possible to obtain the information regarding the detection capacitors corresponding to valleys in a person's fingerprint and the detection capacitors corresponding to ridges in a person's fingerprint, thereby obtaining a fingerprint image of a person, in which the fingerprint image can be further used for fingerprint identification. For example, the driving electrodes of each row of fingerprint identification units are connected to each other to form drive lines, and the detection electrodes of each column of fingerprint identification units are connected to each other to form detection lines. For example, the driving electrode and the detection electrode may be strip electrodes, diamond electrodes, or the like, and the embodiments of the present disclosure are not limited thereto.

For example, the driving electrodes of the M*P rows of fingerprint identification units 11 are in one-to-one correspondence with and connected to the shift scanning output terminals OUT1_1A-OUT1_MP of the M*P shift register units that are cascaded through M*P drive lines Tx1A-TxMP so as to receive driving signals. For example, the detection electrodes of the N*Q columns of fingerprint identification units 11 included in the Q columns of touch units 12 are connected to the receiving switching circuit 60 through N*Q detection lines Rx1A-RxNQ so as to output detection signals.

For example, the data driver circuit 40 is used to provide data signals to the pixel array; the gate driver circuit 50 is used to provide a gate scanning signal to the pixel array. The data driver circuit 40 is electrically connected to the pixel array through the data lines 41, and the gate driver circuit 50 is electrically connected to the pixel array through the gate lines 51.

For example, the control portion 30 supplies control signals to the gate driver circuit 50, the data driver circuit 40, and the driver circuit 20 in response to externally supplied image signals, respectively, so as to control them to perform synchronous operation with each other.

For example, in the touch mode, the P rows and Q columns of fingerprint identification units form a touch unit for operation, and the driver circuit 20 takes every P rows of fingerprint identification units as a unit and performs periodic scanning on the every P rows of fingerprint identification units. The current P rows of fingerprint identification units are simultaneously driven in one cycle, and the next P rows of fingerprint identification units are simultaneously driven in the next cycle. The receiving switching circuit 60 selects every Q columns of fingerprint identification units as a unit to receive the induction signals provided by the every Q columns of fingerprint identification units at the same time, thereby realizing the touch function.

In the fingerprint identification mode, the vertical coordinate of the touch detection position is positioned through the touch function in the touch mode (for example, the x-th first function input signal line TXx), so that a high level is provided to the x-th second function input signal line FPTx according to the x-th first function input signal line TXx, so as to turn on the first row of fingerprint identification units of the x-th touch unit, and the driver circuit 20 scans each row of the subsequent fingerprint identification units in turn; at the same time, the receiving switching circuit 60 sequentially receives the induction signals of Q columns of fingerprint identification units by taking one column of fingerprint identification units as a unit so as to complete the fingerprint identification function. It should be noted that the receiving switching circuit 60 is not limited to receive the induction signals of Q columns of fingerprint identification units in each cycle, and the number of the induction signals received in each cycle is only needed to satisfy the number of receiving channels supported by the fingerprint identification drive chip. For example, the fingerprint identification units in greater than or smaller than Q columns can also be taken as a cycle, depending on the specific situation, and the embodiments of the present disclosure are not limited thereto.

For example, the touch display panel 1 normally works in the touch mode, and the fingerprint identification mode can be turned on through the driver circuit 20 by software and the host terminal. For the specific turning on mode, please refer to the specific description of the working mechanism of the driver circuit 20.

Figure 11:
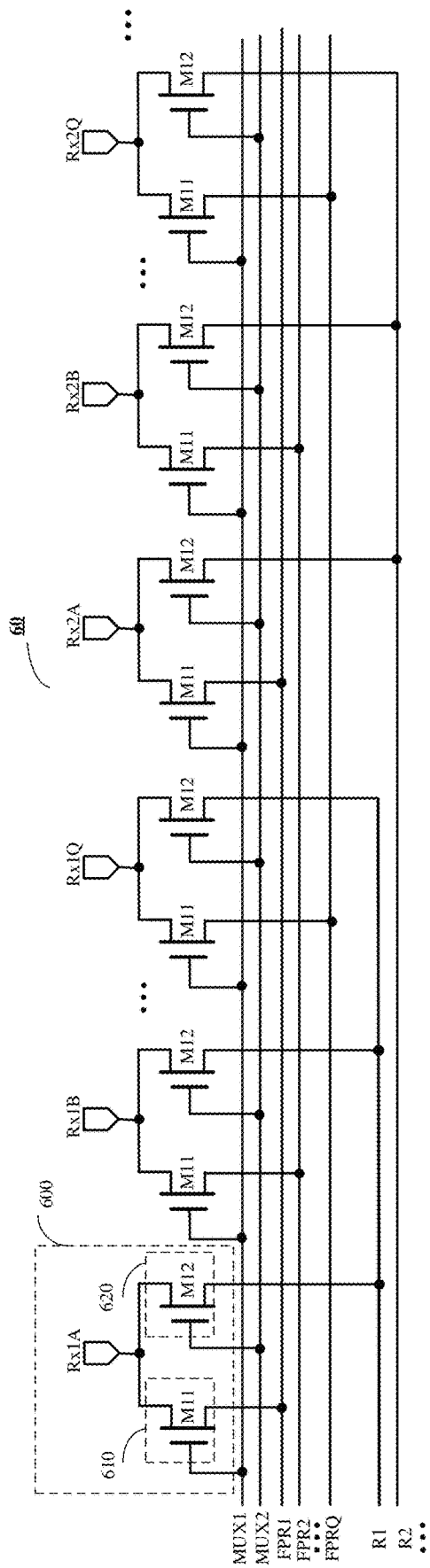
FIG. 11 is a schematic diagram of a receiving switching circuit according to some embodiments of the present disclosure.

FIG. 11 is a schematic diagram of a receiving switching circuit according to some embodiments of the present disclosure. For example, the detection electrodes of N*Q columns of fingerprint identification units 11 are connected to the receiving switching circuit 60 through N*Q detection lines Rx1A-RxNQ so as to transmit detection signals generated by the touch display panel.

For example, the receiving switching circuit 60 is configured to connect Q detection lines of each column of touch units 12 to the same touch detection signal line in response to a switching control signal so as to transmit detection signals output by the each column of touch units to the same touch detection signal line. For example, as illustrated in FIGS. 10A and 11, for example, the first column of touch units are connected to Q detection lines Rx1A-Rx1Q, and the receiving switching circuit 60 connected to the Q detection lines Rx1A-Rx1Q is connected to the same touch detection line R1 so as to transmit the detection signals output by the first column of touch units to the same touch detection signal line R1, and so on.

For example, Q detection lines of different columns of touch units are connected to different touch detection signal lines so as to transmit detection signals output by different columns of touch units to different touch detection signal lines. For example, the second column of touch units are connected to the Q detection lines Rx2A-Rx2Q, and the receiving switching circuit 60 connected to the Q detection lines Rx2A-Rx2Q is connected to the same touch detection line R2 so as to transmit the detection signals output by the second column of touch units to the same touch detection signal line R2. Therefore, the detection signals output by the first column of touch units and the second column of touch units (i.e., different columns of touch units) are respectively transmitted to different touch detection signal lines, and so on.

For example, Q detection lines of a selected column of touch units are connected to different fingerprint detection signal lines FPR1-FPRQ so as to output the detection signals output by Q columns of fingerprint identification units of the selected column of touch units to different fingerprint detection signal lines FPR1-FPRQ. For example, the first detection line Rx1A (connected to the first column of fingerprint identification units) in the first column of touch units is connected to the first fingerprint detection signal line FPR1 through the receiving switching circuit 60, the second detection line Rx1B (connected to the second column of fingerprint identification units) in the first column of touch units is connected to the second fingerprint detection signal line FPR2 through the receiving switching circuit 60, and so on.

The separate output of the touch detection signal and the fingerprint detection signal can be realized through the receiving switching circuit 60, so that the operation mode of the touch display panel can be selected as required.

As illustrated in FIG. 11, the receiving switching circuit 60 includes N*Q receiving switching sub-circuits 600. For example, the N*Q receiving switching sub-circuits 600 are in one-to-one correspondence with and connected to the N*Q detection lines Rx1A-RxNQ of N*Q columns of fingerprint identification units, and the N*Q receiving switching sub-circuits 600 are configured to output detection signals on the Q detection lines of each column of touch units to the same touch detection signal line R in response to switching control signals, to output detection signals on Q detection lines of different columns of touch units to different touch detection signal lines, and to output the detection signals on Q detection lines of Q columns of fingerprint identification units included in a selected column of touch units to different fingerprint detection signal lines FPR1-FPRQ. For specific introduction, please refer to the introduction in the above-mentioned receiving switching circuit, and no further description will be given here.

For example, as illustrated in FIG. 11, each of the N*Q receiving switching sub-circuits 600 includes a first receiving switching sub-circuit 610 and a second receiving switching sub-circuit 620, respectively.

For example, the N*Q first receiving switching sub-circuits 610 are connected, to the first switch control line MUX1 and are in one-to-one correspondence with and connected to the N*Q detection lines RXRx1A-RxNQ, and the N*Q first receiving switching sub-circuits 610 are configured to transmit the detection signals on the N*Q detection lines Rx1A-RxNQ to the corresponding fingerprint detection signal lines FPR1-FPRQ in response to the first switch control signal provided by the first switch control line.

As illustrated in FIG. 11, Q columns of fingerprint identification units, which are taken as a cycle, are respectively connected to Q fingerprint detection signal lines. For example, the first receiving switching sub-circuits 610, which are in one-to-one correspondence with and connected to the Q detection lines Rx1A-Rx1Q of the first column of touch units, are in one-to-one correspondence with and respectively connected to the Q fingerprint detection signal lines Rx1A-Rx1Q, and the first receiving switching sub-circuits 610, which are in one-to-one correspondence with and connected to the Q detection lines Rx2A-Rx2Q of the second column of touch units, are in one-to-one correspondence with and respectively connected to the Q fingerprint detection signal FPR1-FPRQ, and so on. That is, the Q detection lines of each column of touch units are in one-to-one correspondence with and respectively connected to the Q fingerprint detection signal lines FPR1-FPRQ. For example, the first detection line Rx1A of the first column of touch units, the first detection line Rx2A of the second column of touch units, . . . , the first detection line RxNA of the N-th column of touch units are all connected to the first fingerprint detection signal line FPR1, and so on. It should be noted that the above cycle is not limited to Q columns of fingerprint identification units, and the fingerprint identification units in greater than or smaller than Q columns can be selected as a cycle according to the actual situation, and the number of corresponding fingerprint detection signal lines is correspondingly adjusted to be consistent with the number of columns of fingerprint identification units in one cycle.

For example, the q-th (q is an integer greater than 1) first receiving switching sub-circuit 610 is connected to the first switch control line MUX1, the q-th detection line Rxq, and the q-th fingerprint detection signal line FPRq, and is configured to allow the q-th detection line Rxq to be connected to the q-th fingerprint detection signal line FPRq when turned on in response to the first switch control signal provided by the first switch control line, thereby outputting the detection signal received by the q-th detection line Rxq to the q-th fingerprint detection signal line FPRq as a fingerprint identification signal. As such, fingerprint identification at any position in the screen can be realized without increasing the number of channels. For example, the q-th fingerprint detection signal line FPRq outputs the detection signal to a corresponding fingerprint identification unit (not shown in the figure) for subsequent fingerprint identification. For example, a fingerprint identification unit can generate different detection signals according to concave and convex lines of the finger, and can transmit the detection signals to the corresponding fingerprint processing unit, through the receiving switching circuit 60, for performing fingerprint identification. It should be noted that specific fingerprint identification process can be performed by conventional methods in the art, and will not be described here.

For example, the N*Q-th second receiving switching sub-circuits 620 are connected to the second switch control line MUX2 and are in one-to-one correspondence with and connected to the N*Q detection lines Rx1A-RxNQ, and the N*Q-th second receiving switching sub-circuits 620 are configured to transmit the detection signals on the N*Q detection lines Rx1A-RxNQ to the corresponding touch detection signal lines R1-RN in response to the second switch control signal provided by the second switch control line MUX2.

For example, as illustrated in FIG. 11, the second switching sub-circuits 620, which are in one-to-one correspondence with and connected to the Q detection lines Rx1A-Rx1Q of the first column of touch units, are connected to the first touch detection signal line R1, the second switching sub-circuits 620, which are in one-to-one correspondence with and connected to the Q detection lines Rx2A-Rx2Q of the second column of touch units, are connected to the second touch detection signal line R2, and so on. That is, the Q detection lines of each column of touch units are respectively connected to one touch detection signal line.

For example, the Q-th second receiving switching sub-circuits 620 connected to the n-th (n is an integer greater than 1) column of touch units are connected to the second switch control line MUX2, the Q detection lines Rxn1-RxnQ, and the n-th touch detection signal line Rn, and are configured to connect the Q detection lines Rxn1-RxnQ of the n-th column of touch units to the n-th touch detection signal line Rn when being turned on in response to the second switch control signal provided by the second switch control line, thereby outputting the detection signals received by the Q detection lines Rxn1-RxnQ to the n-th touch detection signal line Rn as a touch signal.

Therefore, in the touch mode, the receiving switching circuit 60 selects Q columns of fingerprint identification units as a unit to receive induction signals at the same time, thereby realizing the touch function. In the fingerprint identification mode, the receiving switching circuit 60 can receive the induction signals of Q columns of fingerprint identification units, by taking each column of fingerprint identification units as a unit, to complete the fingerprint identification function, thereby realizing the separate output of the touch detection signal and the fingerprint detection signal, and arbitrarily selecting the operation mode of the touch display panel as required.

For example, the first receiving switching sub-circuit 610 may be implemented as a first receiving transistor M11. The gate electrode of the first receiving transistor M11 is connected to the first switching control line MUX1 so as to receive a first switching control signal, the first electrode of the first receiving transistor M11 is connected to a corresponding detection line Rx so as to receive a detection signal, and the second electrode of the first receiving transistor M11 is connected to a corresponding fingerprint detection signal line FPRq.

For example, the second receiving switching sub-circuit 620 may be implemented as a second receiving transistor M12. The gate electrode of the second receiving transistor M12 is connected to the second switching control line MUX2 so as to receive the second switching control signal, the first electrode of the second receiving transistor M12 is connected to a corresponding detection line Rx so as to receive the detection signal, and the second electrode of the second receiving transistor M12 is connected to a corresponding touch detection signal line Rq.

For example, in one example, the first switch control line MUX1 and the second switch control line MUX2 are the same switch control line. For example, in this example, the type of the transistor for implementing the first receiving switching sub-circuit 610 and the type of the transistor for implementing the second receiving switching sub-circuit 620 are opposite.

It should be noted that some touch display panels 1 in the present embodiment can be any product or component with touch display function such as a liquid crystal TV, a display, an OLED TV, an electronic paper display device, a cellphone, a tablet PC, a notebook, a digital photo frame, a navigator, etc. The touch display panel 1 may further include other conventional components such as a display panel, and the embodiments of the present disclosure are not limited thereto.

As for the technical effect of the touch display panel 1 provided by the embodiments of the present disclosure, reference may be made to corresponding description of the driver circuit 20 in the above embodiment, and will not be described here again.

At least one embodiment of the present disclosure further provides a receiving switching circuit. For example, regarding this receiving switching circuit, reference may be made to the detailed description of the receiving switching circuit 60 as illustrated in FIG. 11, and no further description will be given here.

At least one embodiment of the present disclosure further provides a driving method of the scanning circuit provided by the above embodiment. For example, in one example, the driving method includes the following operations.

The function switching circuit 110 outputs a control signal to the control terminals CTRL1 of the plurality of shift register units 200 that are cascaded at the control signal output terminal CTRL2 in response to the mode switching input signal received by the mode switching input terminal SW, and the plurality of shift register units 200 that are cascaded output a first output signal at the shift scanning output terminal OUT1 in response to the control signal received by the control terminal CTRL1.

The function switching circuit 110 outputs a second output signal to the shift scanning output terminals OUT1 of the plurality of shift register units 200 that are cascaded at the mode scanning output terminal OUT2 in response to the mode switching input signal received by the mode switching input terminal SW.

At least one embodiment of the present disclosure further provides a driving method of the touch display panel provided by the above embodiment. For example, in one example, the driving method includes: in a touch phase, in response to the mode switching input signal, the scanning circuits 10 of the driver circuit 20 sequentially output second output signals according stage numbers of the scanning circuits 10 as a driving signal to the M*N touch units 12, and determines the first function input signal line TXx corresponding to the touch position according to the detection signals provided by the M*N touch units 12; in the fingerprint identification phase, a corresponding second function input signal line FPTx is determined according to the first function input signal line TXx, the second function input signal provided by the second function input signal line FPTx is input to the corresponding scanning circuit 10 in the driver circuit 20 in response to the control signal, and the shift register units 200 in the corresponding scanning circuit 10 are driven to sequentially output the first output signals according stage numbers of the shift register units 200 as a driving signal to each fingerprint identification unit 11 in the M*N touch units 12.

For example, in one example, the touch display panel 1 further includes a receiving switching circuit 60, and the driving method further includes: in the touch phase, in response to the switching control signal, the receiving switching circuit 60 connects Q detection lines of each column of touch units 12 to the same touch detection signal line so as to transmit the detection signals output by the same column of touch units 12 to the same touch detection signal line, connects the Q detection lines of different columns of touch units 12 to different touch detection signal lines so as to transmit the detection signals output by different columns of touch units 12 to different touch detection signal lines; and in the fingerprint identification phase, connects the Q detection lines of a selected column of touch units 12 to different fingerprint detection signal lines so as to output detection signals output by the selected column of touch units 12 to different fingerprint detection signal lines.

At least one embodiment of the present disclosure further provides a driving method of the receiving switching circuit provided by the above embodiment. For example, in one example, the driving method includes: in response to a switching control signal, Q detection lines of each column of touch units 12 are connected to the same touch detection signal line so as to transmit detection signals output by the same column of touch units 12 to the same touch detection signal line, Q detection lines of different columns of touch units 12 are connected to different touch detection signal lines so as to transmit detection signals output by different columns of touch units 12 to different touch detection signal lines, and Q detection lines of a selected column of touch units 12 are connected to different fingerprint detection signal lines so as to output detection signals output by the selected column of touch units 12 to different fingerprint detection signal lines.

As to the technical effects of the driving methods provided by the above embodiments of the present disclosure, reference may be made to corresponding descriptions of corresponding circuits in the above embodiments, which are not repeated here.

The following statements should be noted:

(1) The accompanying drawings of the present disclosure involve only the structure(s) in connection with the embodiment(s) of the present disclosure, and other structure(s) can be referred to common design(s).

(2) In case of no conflict, the embodiments of the present disclosure and features in the embodiments can be combined to obtain new embodiments.

What are described above is related to the illustrative embodiments of the present disclosure only and not limitative to the scope of the disclosure; the scopes of the disclosure are defined by the accompanying claims.

What is claimed is:

1. A scanning circuit, comprising a function switching circuit and a plurality of shift register units that are cascaded,
   wherein each of the plurality of shift register units that are cascaded comprises a control terminal and a shift scanning output terminal, and is configured to output a first output signal at the shift scanning output terminal in response to a control signal received by the control terminal;
   the function switching circuit comprises a mode switching input terminal, a control signal output terminal and a mode scanning output terminal, the control signal output terminal is connected to the control terminals of the plurality of shift register units that are cascaded, and the mode scanning output terminal is connected to the shift scanning output terminals of the plurality of shift register units that are cascaded; and
   the function switching circuit is configured to output the control signal to the control terminals of the plurality of shift register units that are cascaded at the control signal output terminal or to output a second output signal to the shift scanning output terminals of the plurality of shift register units that are cascaded at the mode scanning output terminal, in response to a mode switching input signal received by the mode switching input terminal.

2. The scanning circuit according to claim 1, wherein the function switching circuit comprises an phase-inverting circuit and an output control circuit;
- the phase-inverting circuit is connected to the mode switching input terminal and the control signal output terminal, and is configured to invert a phase of the mode switching input signal received by the mode switching input terminal and to output the phased-inverted mode switching input signal to the control signal output terminal as the control signal; and
- the output control circuit is connected to the mode switching input terminal and the mode scanning output terminal, and is configured to output the second output signal at the mode scanning output terminal in response to the mode switching input signal received by the mode switching input terminal.

3. The scanning circuit according to claim 2, wherein the phase-inverting circuit comprises a first transistor and a second transistor;
- a gate electrode of the first transistor is connected to the mode switching input terminal so as to receive the mode switching input signal, and a first electrode of the first transistor is connected to the control signal output terminal, and a second electrode of the first transistor is connected to a first voltage terminal so as to receive a first voltage; and
- a gate electrode and a first electrode of the second transistor are electrically connected to each other and are both connected to a second voltage terminal so as to receive a second voltage, and a second electrode of the second transistor is connected to the control signal output terminal.

4. The scanning circuit according to claim 3, wherein the output control circuit comprises a third transistor; and
- a gate electrode of the third transistor is connected to the mode switching input terminal so as to receive the mode switching input signal, a first electrode of the third transistor is connected to the second voltage terminal so as to receive the second voltage, and a second electrode of the third transistor is connected to the mode scanning output terminal.

5. The scanning circuit according to claim 1, wherein each of the plurality of shift register units that are cascaded comprises an input circuit, an output circuit, a first node reset circuit, and an output reset circuit;
- the input circuit is connected to an input terminal, a first node and the control terminal, and is configured to output an input signal received by the input terminal to the first node in response to the control signal received by the control terminal;
- the output circuit is connected to the first node and the shift scanning output terminal, and is configured to output the first output signal at the shift scanning output terminal under a control of an electrical level of the first node;
- the first node reset circuit is connected to a reset terminal and the first node, and is configured to reset the first node in response to a reset signal received by the reset terminal;
- the output reset circuit is connected to the reset terminal and the shift scanning output terminal, and is configured to reset the shift scanning output terminal in response to the reset signal received by the reset terminal;
- the input circuit comprises a fourth transistor, wherein a gate electrode of the fourth transistor is connected to the control terminal so as to receive the control signal, a first electrode of the fourth transistor is connected to the input terminal so as to receive the input signal, and a second electrode of the fourth transistor is connected to the first node;
- the output circuit comprises a fifth transistor and a first capacitor, wherein a gate electrode of the fifth transistor is connected to the first node, a first electrode of the fifth transistor is connected to a first clock signal terminal so as to receive a first clock signal as the first output signal, and a second electrode of the fifth transistor is connected to the shift scanning output terminal; a first terminal of the first capacitor is connected to the first node, and a second terminal of the first capacitor is connected to the shift scanning output terminal;
- the first node reset circuit comprises a sixth transistor, wherein a gate electrode of the sixth transistor is connected to the reset terminal so as to receive the reset signal, a first electrode of the sixth transistor is connected to the first node, and a second electrode of the sixth transistor is connected to a first voltage terminal so as to receive a first voltage; and
- the output reset circuit comprises a seventh transistor, wherein a gate electrode of the seventh transistor is connected to the reset terminal so as to receive the reset signal, a first electrode of the seventh transistor is connected to the shift scanning output terminal, and a second electrode of the seventh transistor is connected to the first voltage terminal so as to receive the first voltage.

6. The scanning circuit according to claim 1, wherein the mode switching input terminal of the function switching circuit receives a first function input signal as the mode switching input signal;
- in the plurality of shift register units that are cascaded, an input terminal of a shift register unit of a first stage receives a second function input signal as an input signal;
- an input terminal of a shift register unit of each of other stages except for the first stage is connected to a shift scanning output terminal of a shift register unit of a previous stage of the each of the other stages except for the first stage; and
- a reset terminal of a shift register unit of each of other stages except for a last stage is connected to a shift scanning output terminal of a shift register unit of a next stage of the each of the other stages except for the last stage.

7. A driver circuit, comprising M scanning circuits that are cascaded and according to claim 1, wherein M is an integer greater than 1.

8. The driver circuit according to claim 7, further comprising M first function input signal lines and M second function input signal lines,
- wherein an x-th first function input signal line is connected to a mode switching input terminal in a scanning circuit of an x-th stage so as to provide a first function input signal as the mode switching input signal, and an x-th second function input signal line is connected to an input terminal of a shift register unit of a first stage in the scanning circuit of the x-th stage so as to provide a second function input signal;
- x is an integer greater than or equal to 1 and less than or equal to M;
- the input terminal of the shift register unit of the first stage in the scanning circuit of the x-th stage is further connected to a shift scanning output terminal of a shift register unit of a last stage in a scanning circuit of an (x−1)-th stage:
a reset terminal of a shift register unit of a last stage in the scanning circuit of the x-th stage is connected to a shift scanning output terminal of a shift register unit of a first stage in a scanning circuit of an (x+1)-th stage; and
x is an integer greater than or equal to 2 and less than or equal to M.

9. The driver circuit according to claim 7, further comprising a reset signal line and a plurality of unidirectional input circuits,
wherein the reset signal line is connected to reset terminals of a plurality of shift register units that are cascaded in the M scanning circuits respectively through the plurality of unidirectional input circuits so as to provide an overall reset signal;
input terminals of the plurality of unidirectional input circuits are connected to the reset signal line, and output terminals of the plurality of unidirectional input circuits are in one-to-one correspondence with and connected to reset terminals of the plurality of shift register units that are cascaded in the M scanning circuits;
each of the plurality of unidirectional input circuits comprises a diode; and
a first electrode of the diode is connected to the reset signal line, and a second electrode of the diode is connected to a reset terminal of a corresponding shift register unit.

10. A touch display panel, comprising a driver circuit according to claim 8 and (M*P)*(N*Q) fingerprint identification units arranged in an array,
wherein the (M*P)*(N*Q) fingerprint identification units are divided into M*N touch units arranged in an array, and each of the touch unit comprises P*Q fingerprint identification units arranged in an array;
each of the M scanning circuits included in the driver circuit comprises P shift register units that are cascaded;
M rows of touch units are in one-to-one correspondence with and connected to the M scanning circuits, and P rows of fingerprint identification units included in the each of the M rows of touch units are in one-to-one correspondence with and connected to the P shift register units that are cascaded and included in a corresponding scanning circuit; and
N, P and Q are all integers greater than 1.

11. The touch display panel according to claim 10, wherein each of the fingerprint identification units comprises a driving electrode and a detection electrode; and
driving electrodes of M*P rows of fingerprint identification units included in the M rows of touch units are in one-to-one correspondence with and connected to shift scanning output terminals of M*P shift register units that are cascaded and included in the M scanning circuits in the driver circuit through M*P driving lines so as to receive driving signals.

12. The touch display panel according to claim 11, further comprising a receiving switching circuit,
wherein detection electrodes of N*Q columns of fingerprint identification units included in N columns of touch units are connected to the receiving switching circuit through N*Q detection lines so as to transmit detection signals; and
the receiving switching circuit is configured: in response to a switching control signal,
to connect Q detection lines for each column of the N columns of touch units to same one touch detection signal line so as to transmit detection signals output by the each column of the N columns of touch units to the same one touch detection signal line,
to connect detection lines for different columns of the N columns of touch units to different touch detection signal lines so as to transmit detection signals output by the different columns of the N columns of touch units to the different touch detection signal lines, and
to connect Q detection lines for a selected column of the N columns of touch units to different fingerprint detection signal lines so as to output detection signals output by Q columns of fingerprint identification units in the selected column of the N columns of touch units to the different fingerprint detection signal lines.

13. The touch display panel according to claim 12, wherein the receiving switching circuit comprises N*Q receiving switching sub-circuits;
the N*Q receiving switching sub-circuits are in one-to-one correspondence with and connected to the N*Q detection lines for the N*Q columns of fingerprint identification units; and
the N*Q receiving switching sub-circuits are configured: in response to the switching control signal,
to output detection signals on the Q detection lines for the each column of the N columns of touch units to the same one touch detection signal line,
to output detection signals on the detection lines for the different columns of the N columns of touch units to the different touch detection signal lines, and
to output detection signals on the Q detection lines for the Q columns of fingerprint identification units in the selected column of the N columns of touch units to the different fingerprint detection signal lines.

14. The touch display panel according to claim 13, wherein each of the N*Q receiving switching sub-circuits comprises a first receiving switching sub-circuit and a second receiving switching sub-circuit;
N*Q first receiving switching sub-circuits are connected to a first switch control line, are in one-to-one correspondence with and connected to the N*Q detection lines, and are configured to transmit detection signals on the N*Q detection lines to corresponding fingerprint detection signal lines in response to a first switching control signal provided by the first switch control line; and
N*Q second receiving switching sub-circuits are connected to a second switch control line, are in one-to-one correspondence with and connected to the N*Q detection lines, and are configured to transmit detection signals on the N*Q detection lines to corresponding touch detection signal lines in response to a second switching control signal provided by the second switch control line.

15. A driving method of a touch display panel according to claim 10, comprising:
in a touch phase, sequentially outputting, by the M scanning circuits of the driver circuit, second output signals according to stage numbers of the scanning circuits as driving signals to the M*N touch units in response to the mode switching input signal, and determining a first function input signal line corresponding to a touch position according to detection signals provided by the M*N touch units; and
in a fingerprint identification phase, determining a corresponding second function input signal line according to the first function input signal line corresponding to the touch position, inputting a second function input signal provided by the second function input signal line to a corresponding scanning circuit in the driver circuit in response to the control signal, and driving the shift register units in the corresponding scanning circuit to sequentially output first output signals according to stage numbers of the shift register units as the driving signals to the fingerprint identification units in the M*N touch units.

16. The driving method according to claim 15, wherein the touch display panel further comprises a receiving switching circuit, and the driving method further comprises:
in the touch phase, connecting, by the receiving switching circuit, Q detection lines for each column of touch units to same one touch detection signal line so as to transmit detection signals output by same one column of touch units to the same one touch detection signal line, and connecting, by the receiving switching circuit, detection lines for different columns of touch units to different touch detection signal lines so as to transmit detection signals output by the different columns of touch units to the different touch detection signal lines, in response to a switching control signal, and
in the fingerprint identification phase, connecting Q detection lines for a selected column of touch units to different fingerprint detection signal lines so as to output detection signals output by the selected column of touch units to the different fingerprint detection signal lines.

17. A receiving switching circuit, wherein the receiving switching circuit is configured: in response to a switching control signal,
to connect Q detection lines for each column of touch units to same one touch detection signal line so as to transmit detection signals output by the each column of touch units to the same one touch detection signal line,
to connect detection lines for different columns of touch units to different touch detection signal lines so as to transmit detection signals output by the different columns of touch units to the different touch detection signal lines, and
to connect Q detection lines for a selected column of touch units to different fingerprint detection signal lines so as to output detection signals output by Q columns of fingerprint identification units in the selected column of touch units to the different fingerprint detection signal lines.

18. A driving method of a receiving switching circuit according to claim 17, comprising:
connecting the Q detection lines for the each column of touch units to the same one touch detection signal line so as to transmit the detection signals output by same one column of touch units to the same one touch detection signal line, and connecting the detection lines for the different columns of touch units to the different touch detection signal lines so as to transmit the detection signals output by the different columns of touch units to the different touch detection signal lines, in response to the switching control signal, and
connecting the Q detection lines for the selected column of touch units to the different fingerprint detection signal lines so as to output the detection signals output by the Q columns of the fingerprint identification units in the selected column of touch units to the different fingerprint detection signal lines.

19. The receiving switching circuit according to claim 17, wherein the receiving switching circuit comprises N*Q receiving switching sub-circuits;
the N*Q receiving switching sub-circuits are in one-to-one correspondence with and connected to N*Q detection lines for N*Q columns of fingerprint identification units;
the N*Q receiving switching sub-circuits are configured:
to output detection signals on the Q detection lines for the each column of touch units to the same one touch detection signal line in response to the switching control signal,
to output detection signals on the detection lines for the different columns of the touch units to the different touch detection signal lines, and
to output detection signals on the Q detection lines for the Q columns of the fingerprint identification units in the selected column of touch units to the different fingerprint detection signal lines;
each of the N*Q receiving switching sub-circuits comprises a first receiving switching sub-circuit and a second receiving switching sub-circuit;
N*Q first receiving switching sub-circuits are connected to a first switch control line, are in one-to-one correspondence with and connected to the N*Q detection lines, and are configured to transmit detection signals on the N*Q detection lines to corresponding fingerprint detection signal lines in response to a first switching control signal provided by the first switch control line; and
N*Q second receiving switching sub-circuits are connected to a second switch control line, are in one-to-one correspondence with and connected to the N*Q detection lines, and are configured to transmit detection signals on the N*Q detection lines to corresponding touch detection signal lines in response to a second switching control signal provided by the second switch control line.

20. A driving method of a scanning circuit according to claim 1, comprising:
outputting, by the function switching circuit and at the control signal output terminal, the control signal to the control terminals of the plurality of shift register units that are cascaded in response to the mode switching input signal received by the mode switching input terminal;
outputting, by the plurality of shift register units that are cascaded, the first output signal at the shift scanning output terminal in response to the control signal received by the control terminal; and
outputting, by the function switching circuit and at the mode scanning output terminal, the second output signal to the shift scanning output terminals of the plurality of shift register units that are cascaded in response to the mode switching input signal received by the mode switching input terminal.

* * * * *